US009385505B2

(12) United States Patent
Sugihara et al.

(10) Patent No.: US 9,385,505 B2
(45) Date of Patent: Jul. 5, 2016

(54) LASER LIGHT SOURCE APPARATUS, AND METHOD FOR CONTROLLING TEMPERATURE OF WAVELENGTH CONVERSION ELEMENT IN LASER LIGHT SOURCE APPARATUS

(71) Applicant: USHIO DENKI KABUSHIKI KAISHA, Tokyo (JP)

(72) Inventors: Nobuhiko Sugihara, Himeji (JP); Kazuhiro Yoshida, Himeji (JP); Kentaro Fujita, Himeji (JP); Takanori Samejima, Himeji (JP)

(73) Assignee: USHIO DENKI KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/394,150

(22) PCT Filed: Mar. 28, 2013

(86) PCT No.: PCT/JP2013/059254
§ 371 (c)(1),
(2) Date: Oct. 13, 2014

(87) PCT Pub. No.: WO2013/157372
PCT Pub. Date: Oct. 24, 2013

(65) Prior Publication Data
US 2015/0078409 A1     Mar. 19, 2015

(30) Foreign Application Priority Data

Apr. 19, 2012   (JP) .................................. 2012-095426

(51) Int. Cl.
*H01S 5/06*        (2006.01)
*G02F 1/37*        (2006.01)
(Continued)

(52) U.S. Cl.
CPC .............. *H01S 5/0612* (2013.01); *G02F 1/37* (2013.01); *H01S 3/109* (2013.01);
(Continued)

(58) Field of Classification Search
CPC ... H01S 5/02438; H01S 3/109; H01S 5/0604; H01S 5/0612; H01S 5/024; H01S 5/02407; H01S 5/02415; H01S 5/02453; H01S 5/02461; H01S 5/06837
USPC ...................................................... 372/21–22
See application file for complete search history.

(56) References Cited

U.S. PATENT DOCUMENTS 5,390,210 A * 2/1995 Fouquet et al. ................. 372/92
5,936,987 A * 8/1999 Ohishi et al. ............. 372/29.014
(Continued)

FOREIGN PATENT DOCUMENTS

JP        2009-054446 A      3/2009

OTHER PUBLICATIONS

International Search Report; PCT/JP2013/059254; Jun. 4, 2013.

*Primary Examiner* — Jessica Stultz
*Assistant Examiner* — Sean Hagan
(74) *Attorney, Agent, or Firm* — Studebaker & Brackett PC

(57) ABSTRACT

The wavelength of fundamental wave light emitted from a semiconductor laser is converted by a wavelength conversion element, and the wavelength-converted light is emitted. A power supply circuit feeds electric power to the semiconductor laser. A control part controls an amount of electric power to be fed to a heater such that the wavelength conversion element becomes a temperature that optimizes the wavelength conversion efficiency. Temperatures detected by an element temperature detector and a light source part temperature detector are introduced to the control part, and the control part takes a wavelength conversion element temperature, at which a temperature detected by the light source part temperature detector is minimum, as a set temperature that makes the wavelength conversion efficiency optimal, and feedback-controls the wavelength conversion element temperature such that the wavelength conversion element temperature is at the set temperature by controlling the heating quantity of the heater.

14 Claims, 15 Drawing Sheets

(51) Int. Cl.
    *H01S 3/109*      (2006.01)
    *H01S 5/022*      (2006.01)
    *H01S 5/042*      (2006.01)
    *H01S 5/068*      (2006.01)
    *H01S 5/14*      (2006.01)
    *H01S 5/183*      (2006.01)
    *H01S 5/42*      (2006.01)
    *G02F 1/35*      (2006.01)

(52) U.S. Cl.
    CPC .......... H01S 5/02296 (2013.01); H01S 5/0604 (2013.01); H01S 5/14 (2013.01); *G02F 2001/3546* (2013.01); *H01S 5/0428* (2013.01); *H01S 5/0617* (2013.01); *H01S 5/06804* (2013.01); *H01S 5/06808* (2013.01); *H01S 5/141* (2013.01); *H01S 5/183* (2013.01); *H01S 5/423* (2013.01)

(56) References Cited

U.S. PATENT DOCUMENTS

| | | | |
|---|---|---|---|
| 6,130,901 A * | 10/2000 | Takamine et al. | 372/32 |
| 6,584,127 B2 * | 6/2003 | Matsumoto | 372/34 |
| 7,841,746 B2 | 11/2010 | Kamijijma | |
| 7,899,105 B1 * | 3/2011 | Hargis et al. | 372/102 |
| 2007/0133628 A1 * | 6/2007 | Komatsu et al. | 372/21 |
| 2009/0141749 A1 * | 6/2009 | Wu et al. | 372/22 |

* cited by examiner

-- PRIOR ART --

-- PRIOR ART --

LASER LIGHT SOURCE APPARATUS, AND METHOD FOR CONTROLLING TEMPERATURE OF WAVELENGTH CONVERSION ELEMENT IN LASER LIGHT SOURCE APPARATUS

TECHNICAL FIELD

The present invention relates to a wavelength conversion type laser light source apparatus that uses a nonlinear optical crystal. More particularly, the present invention relates to a wavelength conversion type laser light source apparatus that uses a nonlinear optical crystal, and a temperature control method for a wavelength conversion element in the laser light source apparatus to perform temperature control for the purpose of maximizing conversion efficiency of the nonlinear optical crystal of the laser light source apparatus.

BACKGROUND ART

Developments of a light source apparatus using a laser beam, which is employed as a light source of a projection type projector used at a movie theater, for home theater equipment and the like, are proceeding. One type of the known laser light sources that are employed for such applications uses light directly emitted from a semiconductor laser element, and another type of the known laser light sources converts the light emitted from the semiconductor laser element to light having a different wavelength by a nonlinear optical crystal and uses the resulting light.

Recently, a blue laser light source and a green laser light source are developed, which use PPLN (Periodically Poled Lithium Niobate), PPLT (Periodically Poled Lithium Tantalate) and the like as the nonlinear optical crystal.

Such laser light sources are disclosed in, for example, Patent Literature 1 (Japanese Patent Application Laid-Open Publication No. 2009-54446). Patent Literature 1 describes a laser light apparatus that includes a light source having a semiconductor laser, a wavelength conversion element (i.e., nonlinear optical crystal such as PPLN) to receive a laser beam emitted from the light source and convert it to a laser beam having a second high harmonic wave, and an external resonator (e.g., VBG (Volume Bragg Grating) for selecting light having a predetermined wavelength from the light emitted from the wavelength conversion element and reflecting it toward the light source. Patent Literature 1 also discloses provision of a temperature adjusting unit between the laser light source apparatus and a subspace, in which the wavelength conversion element is mounted. In addition, Patent Literature 1 teaches an improvement in the light conversion efficiency by adjusting the temperature of the wavelength conversion element with the temperature adjusting unit that can adjust the pitch of the polarization reversal period of the wavelength conversion element.

FIG. 18 of the accompanying drawings is a block diagram showing an example of conventional laser light source apparatuses. Referring to FIG. 18, a conventional technology for setting the temperature of the wavelength conversion element to an optimal temperature will be described.

A wavelength conversion element (e.g., PPLN) 5 implemented on a laser light source unit LH has a wavelength conversion function of converting (shortening) the wavelength of light emitted from a laser light source element (e.g., semiconductor laser) 2 to a wavelength shorter than the incident light. For example, the wavelength conversion element 5 may convert infrared light to green light. The laser light source element is referred to as "semiconductor laser" hereinafter.

The wavelength conversion element (e.g., PPLN) 5 has a temperature (optimal temperature) that maximizes the light conversion efficiency. This optimal temperature is different from one element to another element, and the conversion efficiency decreases 10% or more if the temperature of the wavelength conversion element is deviated from the optimal temperature by 0.5 degrees C. Non-converted light simply becomes heat and is consumed.

Therefore, if the optimal temperature condition of the wavelength conversion element is sought and found, generally the following control is performed: the temperature detecting unit Th1 is used to detect the temperature of the wavelength conversion element 5, and the temperature adjusting unit is used to control the heating unit (e.g., heater 7) for heating the wavelength conversion element 5 from the outside such that the temperature of the wavelength conversion element 5 becomes the optimal temperature.

In order to find the optimal control temperature for the wavelength conversion element 5, the conventional technology employs the following approach.

The laser light source unit LH is driven by the laser light source power supply device 100, and the control temperature of the wavelength conversion element 5 is swept (scanned) in an assumed temperature range. In the meantime, the light output measuring device 110 (e.g., photocell, optical power meter or the like) is used to measure the light output emitted from the laser light source unit, as shown in FIG. 18 for example. When the sweeping (scanning) and measurement is finished, that control temperature which had the maximum light output is stored, and this value is taken as the optimal control temperature. The temperature of the wavelength conversion element is then controlled to become the optimal control temperature.

This approach, however, requires a unit for measuring the light output, and needs an additional cost associated with such unit.

FIG. 19 of the accompanying drawings shows a block diagram of another exemplary configuration of the conventional laser light source apparatuses. In this example, the lasers are connected in series.

As illustrated in FIG. 19, it is widely known to arrange a plurality of semiconductor lasers 2 in series inside a single laser light source power supply device 100 for the purpose of reducing the cost of the laser light source apparatus.

In this configuration, the switching elements and the control circuits in the laser light source power supply device 100 may have the same design, and therefore the source for power supply may be provided inexpensively. Three beams of light emitted from the respective laser light source units LH1-LH3 are concentrated (condensed) by optical elements such as prisms PZ, and the concentrated light is emitted.

When a plurality of laser elements are used in this manner, the respective wavelength conversion elements 5 require the optimal temperature adjustment individually. Thus, there is a problem that the optimal temperature adjustment needs significant time.

Specifically, when the measurement is carried out with the photocell as shown in FIG. 18, the sole laser light source unit LH is only measured, and the optimal temperature of this laser light source unit is adjusted. On the other hand, when the laser light source units LH1-LH3 are connected in series as shown in FIG. 19, the same current flows in the three laser elements, and therefore it is not possible to stop one of the three laser elements. As such, the optimal temperature adjustment of the wavelength conversion elements 5 is difficult.

LISTING OF REFERENCE

Patent Literature

PATENT LITERATURE 1: Japanese Patent Application Laid-Open Publication No. 2009-54446

SUMMARY OF THE INVENTION

Problems to be Solved

As described above, when the temperature of the wavelength conversion element is adjusted by the temperature adjusting unit, the light detecting device such as a photodiode must be used to monitor the light output, as shown in FIG. 18. The light detecting device requires calibration and replacement due to the aging and/or deterioration of the light detecting device itself. Further, if the light detecting device is incorporated in the laser light source apparatus, the laser light source apparatus becomes complicated and increases its size.

When a plurality of laser elements are used, the respective wavelength conversion elements require the optimal temperature adjustment individually. Thus, the optimal temperature adjustment needs considerable time. In addition, as shown in FIG. 19, when a plurality of laser elements are arranged in series and lit simultaneously, the light from a neighboring laser element becomes ambient light, and therefore it is not possible to measure a quantity of light accurately. Thus, the temperature for the optimal light conversion efficiency of the wavelength conversion element may not be detected.

The operating temperature of the wavelength conversion element varies with the surrounding environment. Thus, if the operating temperature of the wavelength conversion element changes, the conversion efficiency of the wavelength conversion element changes. As the surrounding environment changes, the wavelength of the semiconductor laser light source, which is wavelength-converted by the wavelength conversion element, changes, and the conversion efficiency of the wavelength conversion element changes. Therefore, it is not possible to obtain a stable optical output.

The present invention intends to solve the above-described problems, and an object of the present invention is to provide a laser light source apparatus that optimizes the wavelength conversion efficiency of the wavelength conversion element, without using a light detecting device such as a photodiode, and enables a stable light output.

Solution to the Problems

In order to achieve the above-mentioned object, an aspect of the present invention provides a laser light source apparatus that includes a light source part. The laser source part has a semiconductor laser, a wavelength conversion element configured to convert a wavelength of a laser beam emitted from the semiconductor laser, and an external resonator configured to select that laser beam which has a prescribed wavelength from the light released from the wavelength conversion element and reflect the selected laser beam toward the semiconductor laser. The laser light source apparatus also includes an element temperature detecting unit configured to detect temperature of the wavelength conversion element, a heating unit configured to heat the wavelength conversion element, a light source part temperature detecting unit configured to detect temperature of the light source part, and a control part configured to control a power supply circuit and the heating unit. The laser light source apparatus controls an amount of electric power to be supplied to the heating unit based on a difference between the temperature detected by the element temperature detecting unit and a set temperature, and performs control such that the temperature of the wavelength conversion element becomes the set temperature. When the wavelength conversion element is irradiated with the laser beam, the set temperature is swept in a range including a control target temperature to detect the temperature of the light source part. The set temperature of the wavelength conversion element of when the light source part temperature becomes minimum is taken as the optimal set temperature of the wavelength conversion element. The amount of electric power to be supplied to the heating unit, which heats the wavelength conversion element, is controlled to maintain the set temperature.

The optimal set temperature may be updated at fixed intervals, with a predetermined condition (e.g., cooling condition, the laser element temperature or the like) being a parameter.

The set temperature may be updated in accordance with variations in the electric power to be supplied to the laser and in the environment temperature (e.g., room temperature) based on a table or formula which is prepared in advance.

In other words, the present invention achieves the above-mentioned object in the following manner.

(1) According to one aspect of the present invention, there is provided a laser light source apparatus that includes a light source part. The laser source part has a semiconductor laser, a wavelength conversion element configured to convert a wavelength of a laser beam emitted from the semiconductor laser, and an external resonator configured to select that laser beam which has a prescribed wavelength from the light released from the wavelength conversion element and reflect the selected laser beam toward the semiconductor laser. The laser light source apparatus also includes a power supply circuit configured to feed electric power to (turn on) the semiconductor laser, an element temperature detecting unit configured to detect temperature of the wavelength conversion element, a heating unit configured to heat the wavelength conversion element, a control part configured to control the power supply circuit and the heating unit, and a light source part temperature detecting unit configured to detect temperature of the light source part. The control part has a temperature controller configured to control an amount of electric power to be supplied to the heating unit based on a difference between the temperature detected by the element temperature detecting unit and a set temperature such that the temperature of the wavelength conversion element becomes the set temperature. The control part also has an optimal temperature setting unit configured to, when the wavelength conversion element is irradiated with the laser beam, measure the light source part temperature at the respective set temperature with the light source part temperature detecting unit while changing the set temperature. The optimal temperature setting unit is also configured to obtain the temperature that makes the light source part temperature minimum, and take this temperature as the optimal set temperature of the wavelength conversion element. The optimal temperature setting unit sets the set temperature to the optimal set temperature.

(2) According to another aspect of the present invention, there is provided another laser light source apparatus, which has a similar configuration as the laser light source apparatus of the first aspect of the invention, but the control part includes a temperature control unit configured to control an output to the heating unit based on the difference between the temperature detected by the element temperature detecting unit and the set temperature such that the wavelength conversion element temperature becomes the set temperature. The control part of the laser light source apparatus also includes an optimal temperature sequentially setting unit configured to alter the set temperature and measure the light source part temperature at the respective set temperature when the light source part has a certain temperature and the wavelength conversion element is irradiated with the laser beam. The optimal temperature sequentially setting unit then obtains the temperature that makes the light source part temperature minimum, and takes (sets) this temperature as a first (initial) optimal set temperature of the wavelength conversion element at the above-mentioned temperature of the light source part. The optimal temperature sequentially setting unit calculates a set temperature correction value to the optimal set temperature, with the light source part temperature and/or the condition of the electric power to be supplied to the laser being the parameter. With this correction value, the optimal temperature sequentially setting unit corrects the set temperature to the optimal set temperature sequentially at fixed intervals.

(3) According to still another aspect of the present invention, there is provided a method of controlling temperature of a wavelength conversion unit of a laser light source apparatus. The laser light source apparatus includes a light source part, and the laser source part has a semiconductor laser, a wavelength conversion element configured to convert a wavelength of a laser beam emitted from the semiconductor laser, and an external resonator configured to select that laser beam which has a prescribed wavelength from the light released from the wavelength conversion element and reflect the selected laser beam toward the semiconductor laser. The laser light source apparatus also includes a power supply circuit configured to feed electric power (turn on) to the semiconductor laser, an element temperature detecting unit configured to detect temperature of the wavelength conversion element, a light source part temperature detecting unit configured to detect the light source part temperature, and a heating unit (heater) configured to heat the wavelength conversion element. The laser light source apparatus controls an amount of electric power to be supplied to the heating unit based on a difference between the temperature detected by the element temperature detecting unit and a set temperature, and performs control such that the temperature of the wavelength conversion element becomes the set temperature. The method includes a first step of altering the set temperature and measuring the light source part temperature at the respective set temperature with the light source part temperature detecting unit when the wavelength conversion element is irradiated with the laser beam. The first step also includes obtaining the temperature that makes the light source part temperature minimum, and taking this temperature as an optimal set temperature of the wavelength conversion element. The method also includes a second step of setting the set temperature to the optimal set temperature. The method also includes a third step of controlling an amount of electric power to be supplied to the heater such that the temperature of the wavelength conversion element becomes the optimal set temperature.

(4) According to yet another aspect of the present invention, there is provided another method of controlling temperature of a wavelength conversion unit of a laser light source apparatus. The laser light source apparatus includes a light source part, and the laser source part has a semiconductor laser, a wavelength conversion element configured to convert a wavelength of a laser beam emitted from the semiconductor laser, and an external resonator configured to select that laser beam which has a prescribed wavelength from the light released from the wavelength conversion element and reflect the selected laser beam toward the semiconductor laser. The laser light source apparatus also includes a power supply circuit configured to feed electric power (turn on) to the semiconductor laser, an element temperature detecting unit configured to detect temperature of the wavelength conversion element, a light source part temperature detecting unit configured to detect the light source part temperature, and a heating unit (heater) configured to heat the wavelength conversion element. The laser light source apparatus controls an amount of electric power to be supplied to the heating unit based on a difference between the temperature detected by the element temperature detecting unit and a set temperature, and performs control such that the temperature of the wavelength conversion element becomes the set temperature. The method includes a first step of detecting the light source part temperature, altering the set temperature while the wavelength conversion element is being irradiated with the laser beam, and measuring the light source part temperature at the respective set temperature with the light source part temperature detecting unit. The first step also includes obtaining the temperature that makes the light source part temperature minimum, and taking this temperature as a first optimal set temperature of the wavelength conversion element at the detected temperature of the light source part. The first step also includes calculating a set temperature correction value at (for) a different light source part temperature, with the light source part temperature and/or the condition of electric power to be supplied to the laser being the parameter. The method also includes a second step of correcting the set temperature to the optimal set temperature sequentially at fixed intervals, based on the set temperature correction value. The method also includes a third step of controlling an amount of electric power to be supplied to the heater such that the temperature of the wavelength conversion element becomes the optimal set temperature.

Advantageous Effects of the Invention

The present invention has the following advantageous effects.

(1) It is possible to obtain the wavelength conversion element temperature that optimizes the wavelength conversion efficiency by detecting the temperature that makes the light source part temperature minimum, without using a light detecting device such as a photodiode. By controlling the wavelength conversion element to have the temperature that optimizes the wavelength conversion efficiency, it is possible to obtain a stable light output (optical output).

Because the light detecting device such as a photodiode is not necessary, calibration and other works are not needed.

If a plurality of laser light source units are included in the laser light source apparatus, it is possible to simultaneously set the optimal temperatures of the wavelength conversion elements, which optimize the respective wavelength conversion efficiency for the respective laser light source units. This significantly reduces the work time.

(2) The optimal temperature of the wavelength conversion element is obtained relative to (in consideration of) the light source part temperature and the condition of the electric power to be supplied to the semiconductor laser. The set temperature correction value is calculated, with the apparatus temperature and/or the condition of the electric power to be supplied to the laser being the parameter. The set temperature is updated to the optimal set temperature sequentially at the fixed intervals. Thus, the feedback control is performed such that the temperature of the wavelength conversion element becomes the set temperature. Even during the operation of the apparatus, therefore, it is always and easily possible to keep the wavelength conversion element temperature at an optimal temperature. Accordingly, high optical conversion is stably obtained, and highly efficient apparatus can be provided with its overall cost being reduced.

BRIEF DESCRIPTION OF THE DRAWINGS

FIG. 13(*b*) illustrates relationship between the input electric power supplied upon turning on the laser and the optimal set temperature of the wavelength conversion element.

DESCRIPTION OF EMBODIMENTS

Figure 1:
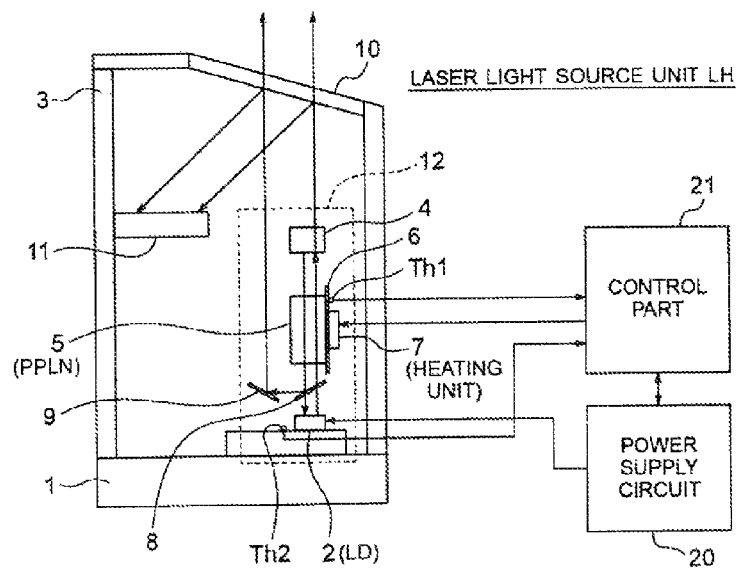
FIG. 1 illustrates a configuration of a laser light source apparatus according to one embodiment of the present invention.

FIG. 1 illustrates a configuration of a laser light source apparatus according to an embodiment of the present invention.

As shown in FIG. 1, the laser light source apparatus includes a laser light source unit LH, a power supply circuit 20 for feeding electric power to (turning on) a semiconductor laser, and a control part 21.

In the laser light source unit LH, a shielding container (insulating container) 3 that may be made from aluminum is mounted on a base plate 1 that serves as a heat sink and is made from a material having a high thermal conductivity such as copper (Cu). The shielding container 3 prevents leakage of the laser beam, and shields components and members which are housed in the container 3 from the ambient air and dusts. The shielding container 3 also thermally insulates the components and members which are housed in the container 3.

In the shielding container 3, a semiconductor laser 2 that emits infrared light, as a fundamental wave light, is provided on the base plate 1. The semiconductor laser 2 is, for example, an external resonator type plane emission (surface emission) laser array that emits light at a 1064 nm wavelength.

A fundamental wave light reflecting element 4 (e.g., VBG or Volume Bragg Grating) is disposed at a position that faces the semiconductor laser 2. The fundamental wave light reflecting element 4 reflects light components having a particular narrowband wavelength range in the fundamental wave light at a high reflectivity (e.g., 99.5%). The fundamental wave light reflecting element 4 serves as an external resonator relative to the semiconductor laser 2. The fundamental wave light reflecting element 4 allows the converted light to pass therethrough.

A wavelength conversion element (e.g., PPLN or Periodically Poled Lithium Niobate) 5 is disposed between the semiconductor laser 2 and the fundamental wave light reflecting element 4. The wavelength conversion element 5 converts part of the light having a wavelength in the wavelength range of the fundamental wave light (light having a phase-matched wavelength; phase matching temperature is, for example, 80-100 degrees C.) to light having a converted wavelength (second high harmonic wave or SHG). The wavelength conversion element 5 converts the infrared light, which is the fundamental wave light emitted from the semiconductor laser 2, to visible light or ultraviolet light.

A heat transfer plate 6 is in thermal contact with the wavelength conversion element 5. A heating unit (e.g., heater) 7 for heating the wavelength conversion element 5 and a temperature detecting unit Th1 (e.g., thermistor) for detecting the temperature of the wavelength conversion element 5 are disposed on the heat transfer plate 6.

The semiconductor laser 2, the wavelength conversion element 5, and the fundamental wave light reflecting element 4 constitute an external resonator type vertical plane emission laser device. In this embodiment, a combination of the semiconductor laser 2, the wavelength conversion element 5 and the fundamental wave light reflecting element 4 is referred to as a "light source part 12."

A light source part temperature detecting unit (e.g., thermistor) Th2 for detecting the temperature of the light source part 12 is provided on the base plate 1 in the vicinity of the semiconductor laser 2.

It should be noted that the light source part temperature detecting unit Th2 may be disposed at any suitable location as long as the light source part temperature detecting unit Th2 can detect the temperature in the vicinity of the light source part 12 (except for the temperature of the wavelength conversion element 5 itself). For example, the light source part temperature detecting unit Th2 may be disposed in the vicinity of the semiconductor laser 2 or the fundamental wave light reflecting element 4 instead of the base plate 1.

A dichroic output mirror 10 is provided on that surface of the shielding container 3 which faces the base plate 1. The wavelength-converted light that passes through the fundamental wave light reflecting element 4 is emitted to the outside from the dichroic output mirror 10.

The dichroic output mirror 10 does not allow the fundamental wave light, which is not reflected by the fundamental wave light reflecting element 4 and has passed through the fundamental wave light reflecting element 4, to pass through the dichroic output mirror 10 and reflects it. The fundamental wave light reflected by the dichroic output mirror 10 is incident on a beam dump 11 (e.g., aluminum plate that has undergone a black alumite treatment) and absorbed therein. The beam dump 11 thermally contacts the shielding container 3.

A dichroic mirror 8 is provided between the semiconductor laser 2 and the wavelength conversion element 5. The dichroic mirror 8 allows the fundamental wave light to pass therethrough and reflects the wavelength-converted light to laterally extract the wavelength-converted light. The wavelength-converted light reflected by the dichroic mirror 8 is reflected by a reflection mirror 9 in the same direction as the wavelength-converted light that has passed the fundamental wave light reflecting element 4. Then, the wavelength-converted light passes through the dichroic output mirror 10 and is emitted.

Therefore, the light source part 12 of the laser light source apparatus according to the embodiment of the present invention includes the wavelength conversion element 5 for wavelength converting the fundamental wave light, which is emitted from the semiconductor laser 2, and the fundamental wave light reflecting element 4 (e.g., VBG) disposed on the light emission side of the wavelength conversion element 5 for reflecting, at a high reflectivity, the light having a particular narrowband wavelength range of the fundamental wave light among the light emitted from the wavelength conversion element 5. The fundamental wave light reflecting element 4 serves as the external resonator relative to the semiconductor laser 2.

It should be noted that although holding members and the like are provided for holding and/or supporting the respective members, such holding members and the like are not shown in FIG. 1.

In FIG. 1, the fundamental wave light emitted from the semiconductor laser 2 is incident on the wavelength conversion element 5 through the dichroic mirror 8, as indicated by the arrow in FIG. 1.

Part of the light which is incident on the wavelength conversion element 5 is wavelength converted. The wavelength-converted light passes through the fundamental wave light reflecting element 4 and is emitted through the dichroic output mirror 10. The fundamental wave light, which is not wavelength converted by the wavelength conversion element 5, is reflected by the fundamental wave light reflecting element 4 and incident on the wavelength conversion element 5 such that the fundamental wave light is wavelength converted by the wavelength conversion element 5. The wavelength-converted light is reflected by the dichroic mirror 8, and emitted through the reflection mirror 9 and the dichroic output mirror 10.

The fundamental wave light, which is not wavelength converted by the wavelength conversion element 5 and incident on the dichroic mirror 8, passes through the dichroic mirror 8 and is incident on the semiconductor laser 2.

On the other hand, the fundamental wave light which is not reflected by the fundamental wave light reflecting element 4 and has passed through the fundamental wave light reflecting element 4, and the fundamental light which has not passed through the dichroic mirror 8 and is reflected by the dichroic mirror 8 and the reflection mirror 9 is reflected by the dichroic output mirror 10, is incident on the beam dump 11 and absorbed by the beam dump 11, as indicated by the arrow in FIG. 1.

The wavelength conversion element 5 may be made from lithium niobate ($LiNbO_3$) having a periodically poled structure, lithium niobate doped with magnesium ($MgO:LiNbO_3$), lithium tantalum niobate ($LiTaNbO_3$), lithium tantalate ($LiTaO_3$), or potassium phosphate titanate ($KTiOPO_4$). In general, the wavelength conversion element 5 may include a quasi phase matching type wavelength conversion element such as the periodically poled lithium niobate (PPLN), the periodically poled magnesium-doped lithium niobate (PP-MgLN), the periodically poled lithium tantalate (PPLT), or the periodically poled potassium phosphate titanate (PP-KTP).

As shown in FIG. 1, the light source apparatus of this embodiment includes a control part 21 and a power supply circuit 20.

The power supply circuit 20 supplies pulse electric power (electricity) to the semiconductor laser 2 to feed electric current to (turn on) the semiconductor laser 2. The control part 21 controls the operation of the laser light source apparatus (e.g., the control part 21 controls the power supply circuit 20) and also controls the temperature of the wavelength conversion element 5 such that the wavelength conversion element 5 operates at a temperature that achieves an optimal wavelength conversion efficiency (such that the wavelength conversion element 5 operates at an optimal wavelength conversion efficiency at the controlled temperature).

Specifically, the temperature of the wavelength conversion element 5 which is detected by the temperature detecting unit Th1 is introduced to the control part 21, and the control part 21 takes, as the optimal set temperature of the wavelength conversion element 5, the temperature of the wavelength conversion element 5 when the temperature of the light source part 12 detected by the light source part temperature detecting unit Th2 becomes minimum (will be described later). The control part 21 performs the feedback control on the temperature of the wavelength conversion element 5 such that a quantity of heating from the heating unit 7 is controlled to cause the temperature of the wavelength conversion element 5 to become the optimal set temperature (will be described with reference to the first embodiment).

Alternatively, the control part 21 may obtain an optimal set temperature of the wavelength conversion element 5 based on the temperature of the light source part 12 detected by the light source part temperature detecting unit Th2, the electric power condition applied to the semiconductor laser 2 and the like (will be described later), and may control the temperature of the wavelength conversion element 5 with this optimal set temperature (will be described with reference to the second embodiment).

Figure 2:
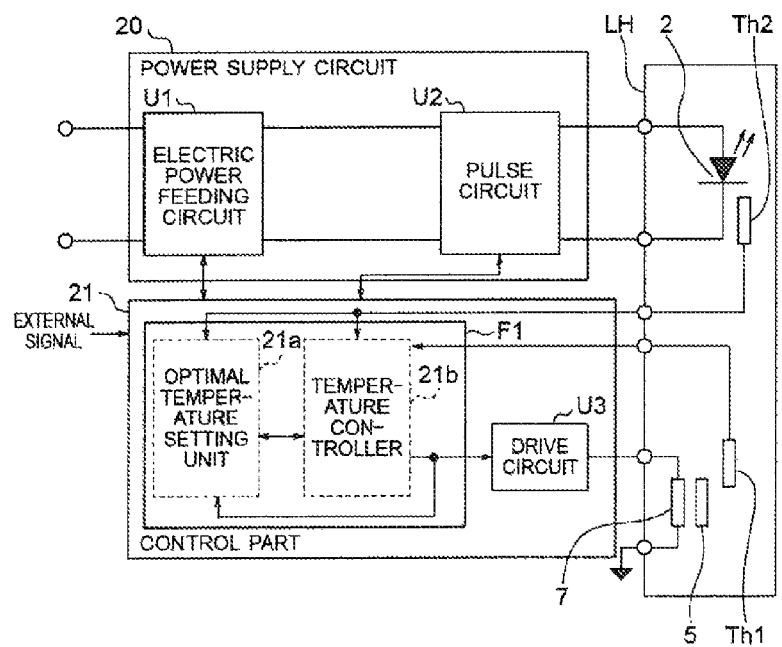
FIG. 2 is a block diagram of a control part and a power supply circuit in the laser light source apparatus of the first embodiment of the present invention.

FIG. 2 is a block diagram showing the configuration of the control part and the power supply circuit in the laser light source apparatus according to the first embodiment of the present invention.

As shown in FIG. 2, the power supply circuit 20 includes an electric power feeding circuit U1 and a pulse circuit U2. The electric power feeding circuit U1 may include a switching circuit such as a step-down chopper, a step-up (boosting) chopper, or other types of switching circuit, together with other components. The pulse circuit U2 feeds the pulse electric power. The power supply circuit 20 sends an appropriate voltage and/or current to the semiconductor laser 2 in accordance with the state (condition) of the semiconductor laser 2 or the power supply sequence (lighting sequence).

It is well known that if a certain type of laser is used, a square wave (or rectangular wave) pulse voltage having a frequency of approximately several hundred kHz is applied to the laser. In this embodiment, the pulse circuit U2 is located on the output side of the electric power feeding circuit U1, generates the pulse at a desired frequency, and sends the pulse to the semiconductor laser 2.

It should be noted that when a different type of laser is used, the above-described configuration may not be used. For example, the pulse circuit U2 may be dispensed with, and the output voltage from the electric power feeding circuit U1 may directly be supplied to a laser light source that corresponds to (is associated with) the semiconductor laser 2.

The semiconductor laser 2 used in this embodiment is configured to emit infrared light, and has the wavelength conversion element 5 (e.g., PPLN) which is an element for converting the wavelength of the infrared light such that the infrared light is converted to visible light.

When the temperature of the wavelength conversion element 5 is elevated to a prescribed temperature, quasi phase matching takes place in the wavelength conversion element 5. This increases the light conversion efficiency. Thus, the wavelength conversion element 5 requires highly precise temperature control. For this reason, the laser light source unit LH also has the wavelength conversion element 5 and the heating unit 7 (referred to as "heater 7" hereinafter) for heating the wavelength conversion element 5. The element temperature detecting unit Th1 (e.g., thermistor) is provided in the laser light source unit LH to detect the temperature of the heater 7 (i.e., temperature of the wavelength conversion element 5).

The control part 21 includes a control unit F1 and a drive circuit U3 for driving the heater 7.

The electric power feeding circuit U1 is controlled by the control unit F1, which has an arithmetic processing device (CPU or microprocessor), such that the voltage to be applied to the semiconductor laser 2 or the current to flow in the semiconductor laser 2 becomes a predetermined value or a value decided (entered) from outside. The start and stop of the electric power feeding from the electric power feeding circuit U1 is also controlled by the control unit F1.

The pulse circuit U2 is controlled by the control unit F1. The control unit F1 decides an optimal pulse frequency and a duty cycle ratio to obtain a high light output efficiency. The control unit F1 turns on and off the switching element of the pulse circuit U2 in accordance with the decided pulse frequency and duty cycle ratio such that the pulse circuit U2 generates the pulse electric power to drive the semiconductor laser 2.

The control unit F1 has an optimal temperature setting unit 21a and a temperature controller 21b.

The temperature controller 21b controls an amount of electric power to be fed to the heater 7 based on the difference between the temperature detected by the element temperature detecting unit Th1 and the set temperature decided (set) by the optimal temperature setting unit 21a, such that the temperature of the wavelength conversion element 5 becomes the set temperature.

When the wavelength conversion element 5 is irradiated with the laser beam, the optimal temperature setting unit 21a changes the set temperature, and monitors the temperature of the light source part 12 detected by the light source part temperature detecting unit Th2 at the respective set temperatures to obtain the set temperature that makes the light source part temperature minimum. The optimal temperature setting unit 21a takes this set temperature as the optimal set temperature. The optimal temperature setting unit 21a sets this set temperature to the optimal set temperature.

In other words, the temperature controller 21b of the control unit F1 drives the drive circuit U3 to control the quantity of electric power fed to the heater 7, and performs the feedback control such that the temperature of the wavelength conversion element 5 detected by the element temperature detecting unit Th1 becomes the optimal set temperature.

Specifically, the control unit F1 sends to the drive circuit U3 a signal, which represents the quantity of electric power to be fed, to control the quantity of electric power fed to the heater 7, the drive circuit U3 drives the heater 7, and the control unit F1 performs the feedback control such that the temperature of the wavelength conversion element 5 becomes the optimal set temperature.

The drive circuit U3 may decide the voltage level (may output the voltage level), or may use the PWM (pulse width modulation) to control the quantity of electric power to be fed.

Figure 3:
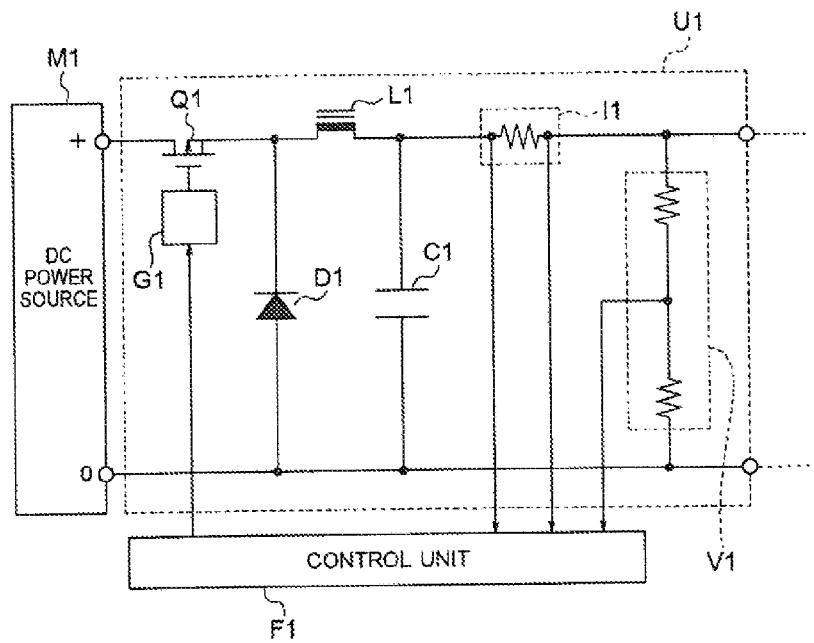
FIG. 3 illustrates a concrete and exemplary configuration of an electric power feeding circuit according to the embodiment of the present invention.

FIG. 3 illustrates an exemplary concrete configuration of the electric power feeding circuit U1 which can be used in the power supply circuit 20 of the laser light source apparatus of this embodiment.

The electric power feeding circuit U1, which has the step-down chopper as the main component, operates upon receiving the voltage from a DC power source M1, and regulates (adjusts) an amount of electric power to be fed to the semiconductor laser 2.

In the electric power feeding circuit U1, a switching element Q1 such as FET (field effect transistor) is driven by the control unit F1 to turn on and off the current from the DC power source M1 such that a smoothing capacitor C1 is charged via a choke coil L1 and the current is supplied to the semiconductor laser 2. When the switching element Q1 is in the ON condition, the current that passes through the switching element Q1 is directly used to charge the smoothing capacitor C1 and is directly supplied to the semiconductor laser 2, which is the load. Also, an energy is stored in the choke coil L1 in the form of magnetic flux. When the switching element Q1 is in the OFF condition, the energy stored in the choke coil L1 in the form of magnetic flux is used to charge the smoothing capacitor C1 via a flywheel diode D1 and supply the current to the semiconductor laser 2.

The stop of the electric power feeding of the electric power feeding circuit U1, which is described with reference to FIG. 2, refers to a deactivated state of the electric power circuit U1 when the switching element Q1 is in the OFF condition.

In the step-down chopper type electric power feeding circuit U1, the amount of electric power to be fed to the semiconductor laser 2 can be adjusted based on the ratio of the time for the switching element Q1 being in the ON condition to the operation cycle of the switching element Q1, i.e., the duty cycle ratio. In this embodiment, a gate drive signal having a predetermined (certain) duty cycle is generated by the control unit F1, and a gate terminal of the switching element Q1 is controlled via a gate drive circuit G1 to regulate the ON (feeding) and OFF (no feeding) of the current from the DC power source.

In this embodiment, the current and voltage to the semiconductor laser 2 are detected by a current detector I1 for detecting the fed electric power-based current and a voltage detector V1 for detecting the fed electric power-based voltage, respectively. The current detector I1 for the fed electric power-based current may easily be implemented by a shunt resistance. The voltage detector V1 for the fed electric power-based voltage may easily be implemented by a voltage dividing resistance.

A current detection signal from the current detector I1 and a voltage detection signal from the voltage detector V1 are introduced to the control unit F1, and the control unit F1 generates the gate drive signal to perform the ON/OFF control on the switching element Q1 such that the feedback control is carried out to generate an expected current. In this manner, an appropriate electric power or current can be supplied to the laser.

Figure 4:
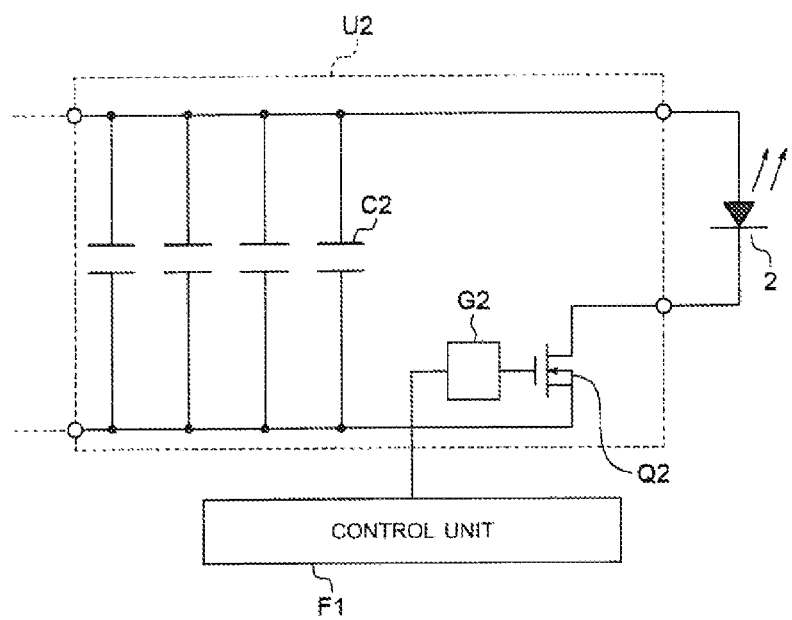
FIG. 4 illustrates a simplified and exemplary configuration of a pulse circuit according to the embodiment of the present invention.

FIG. 4 schematically shows an exemplary configuration of the pulse circuit U2 which may be used in the power supply circuit 20 of the laser light source apparatus according to this embodiment.

The pulse circuit U2 has a circuitry that uses a switching element Q2 such as an FET.

The switching element Q2 is driven in response to a signal that is generated by the control unit F1 and supplied through a gate drive circuit G2. The switching element Q2 repeats the ON and OFF operations at a high speed. Every time the switching element Q2 becomes the ON condition, the electric power is supplied to the semiconductor laser 2 from a capacitor group C2, which is charged by the electric power from the electric power feed circuit U1, via the switching element Q2.

For example, when a pulse voltage having a square waveform at a frequency of an approximately several hundred kHz is applied to the laser, the pulse drive scheme can decrease a junction temperature in the semiconductor element (e.g., laser diode) more than a simple DC drive scheme. As a result, the pulse drive scheme can increase the light output efficiency. In general, when the laser diode is driven by the DC drive scheme, a forward voltage drops more, as compared with the pulse drive scheme. Thus, if the same amount of electric power should be supplied to the laser diode, the DC drive scheme requires an increased amount of current to be supplied. This would result in an increased loss due to the increased current, and elevate the junction temperature.

In any case, the control unit F1 can decide an optimal pulse frequency and an optimal duty cycle ratio to obtain higher light output efficiency, and drive the semiconductor laser 2 in accordance with such pulse frequency and duty cycle ratio. It should be noted, however, that if the cost is concerned, the pulse circuit U2 may be dispensed with, with the understanding that some deterioration in the light output efficiency may occur, and the semiconductor laser 2 and other components may directly be driven by the DC drive scheme.

Figure 5:
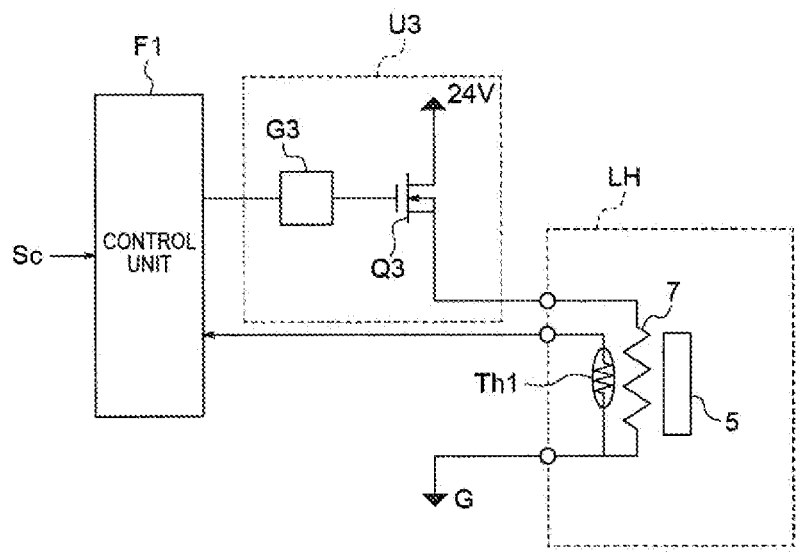
FIG. 5 illustrates connection among a drive circuit, a control unit, a heater and other components.

FIG. 5 schematically illustrates an exemplary connection between the drive circuit U3 and the control unit F1 as well as the wavelength conversion element 5 and other components in the laser light source apparatus of this embodiment.

The laser light source unit LH has the wavelength conversion element 5, and possesses a certain condition to obtain (realize) the maximum light output, i.e., condition to maximize the light wavelength conversion efficiency. This condition is the temperature of the wavelength conversion element 5. High conversion efficiency is obtained by giving an appropriate temperature condition. Therefore, a mechanism is needed for elevating the temperature of the wavelength conversion element 5 from outside to adjust the temperature of the wavelength conversion element 5 to an optimal temperature. For this reason, the heater 7 is provided in the vicinity of the wavelength conversion element 5, and the heater 7 is controlled such that the temperature of the wavelength conversion element 5 becomes the optimal temperature.

An additional description about the appropriate temperature condition for the wavelength conversion element 5 will be given. Because of the manufacturing factors, the structure of the wavelength conversion element 5, actual manufacturing environment (limitations) and the like, the manufactured wavelength conversion elements 5 have different optimal temperature values (e.g., the optimal temperature values vary between, for example, about 80 and 100 degrees C.). Thus, similar variations exist in the optimal temperature (range).

The arithmetic processing device (CPU or microprocessor) of the control unit F1 performs the control such that the above-described optimal temperature condition of the wavelength conversion element 5 is met.

In order to maintain the temperature of the wavelength conversion element 5 at a desired temperature, the temperature of the heater 7 is controlled. This is the indirect control to the temperature of the wavelength conversion element 5. For this reason, the temperature detecting unit Th1 is disposed on the heat transfer plate 6 in the vicinity of the heater 7 (see FIG. 1).

As described above, the control unit F1 has the optimal temperature setting unit 21a and the temperature controller 21b, and the temperature controller 21b of the control unit F1 obtains the temperature information of the wavelength conversion element 5 from the temperature detecting unit Th1. The set temperature decided by the optimal temperature setting unit 21a is compared with the temperature detected by the temperature detecting unit Th1, and the feedback control is performed on the amount of electric power to be fed to the heater 7.

The electric power may be fed to the heater 7 by sending a pulse signal (PWM signal) from the control unit F1 to the gate terminal of the switching element Q3 through the gate drive circuit G3 of the drive circuit U3 and performing the ON/OFF control on the switching element Q3.

As a result of such electric power feeding, a prescribed pulse voltage is applied to the heater 7 from the DC power source (e.g., 24V DC power source) at a predetermined cycle. In this manner, the control unit F1 controls (regulates) the amount of electric power to be fed to the heater 7, and consequently performs the stable control to bring the temperature of the wavelength conversion element 5 to the optimal temperature.

It should be noted that the power supply circuit is given the optimal set temperature of the wavelength conversion element 5 in advance. For this reason, the target temperature for the control of the heater 7 may be given to the power supply source device in the form of an external signal Sc by serial communication. In this embodiment, however, the set temperature is scanned (swept) in a range including the control target temperature while the wavelength conversion element 5 is being irradiated with the laser beam, and the temperature of the light source part 12 is measured to obtain the temperature that makes the temperature of the light source part 12 minimum (lowest). Then, this temperature is taken as the optimal set temperature (will be described later). The target temperature information is written and stored in a storage element (e.g., EEPROM or Flash ROM) disposed in the control unit F1.

Figure 6:
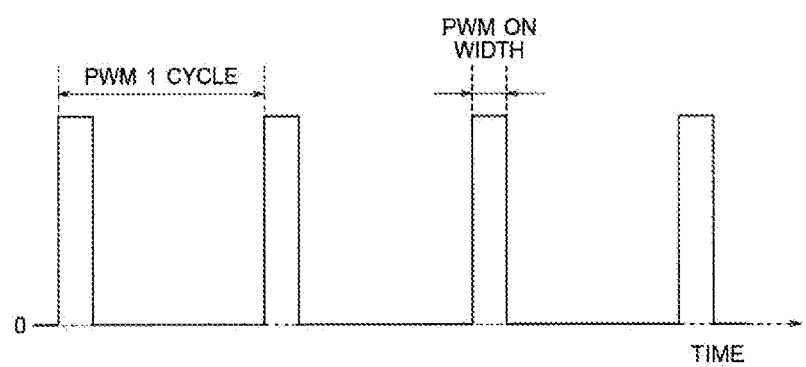
FIG. 6 is a timing chart showing an exemplary waveform of a current to be supplied to the heater from the drive circuit.

FIG. 6 depicts a schematic timing chart of a waveform of the current supplied to the heater 7 from the drive circuit U3 in the power supply circuit of the laser light source apparatus of this embodiment of the present invention.

In order to perform the feedback control on the amount of electric power to be fed to the heater 7, the temperature controller 21*b* of the control unit F1 decides the PWM one cycle and the PWM signal ON width as shown in FIG. 6, and generates the PWM signal.

Alternatively, a signal representing an analog value that is similar to the PWM signal (frequency modulated signal) may be generated instead of the PWM signal.

Increase and decrease in the ON width of the signal can adjust the amount of electric power to be fed to the heater 7, and control the temperature of the wavelength conversion element 5.

An exemplary scheme for the above-described feedback control may be a known scheme that is generally referred to as "ON-OFF PID control." The PID control is a combination of proportional control, integral control and derivative control to achieve the target temperature. The frequency of the PWM (signal) output in this embodiment is, for example, approximately several kHz.

Figure 7:
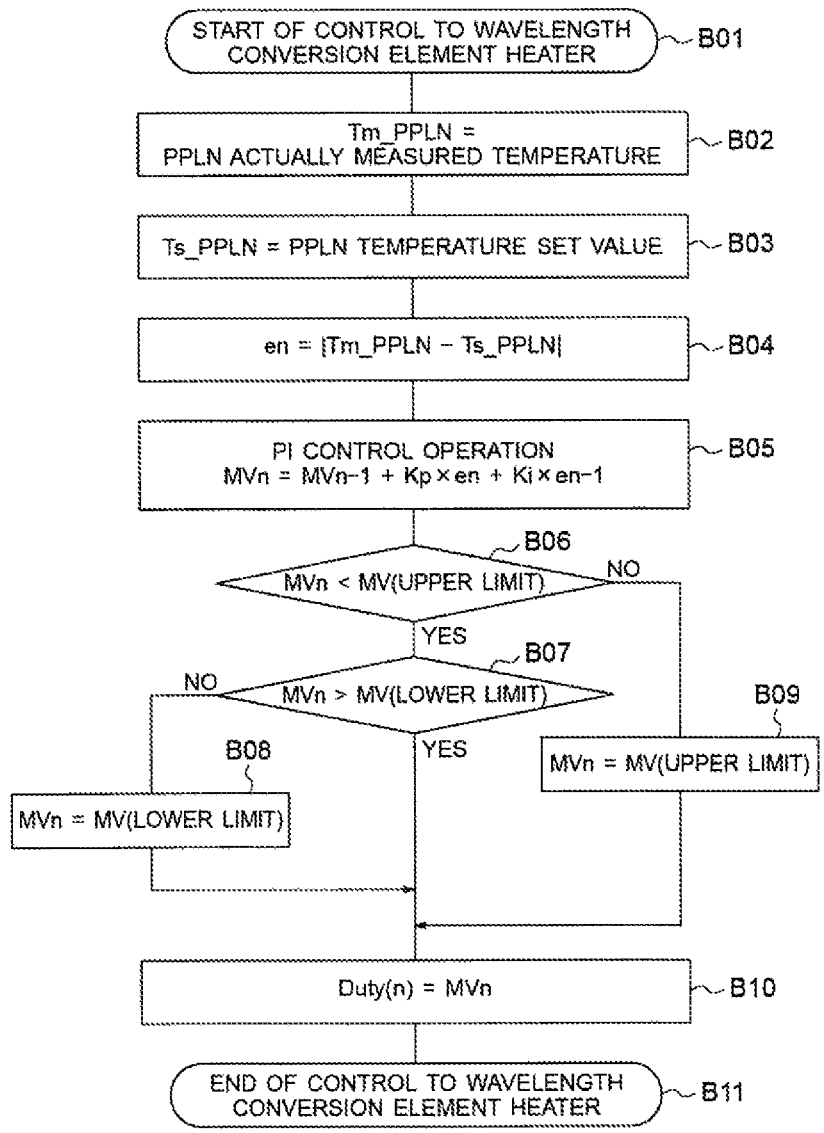
FIG. 7 is a flowchart showing an exemplary processing performed by a temperature controller of the control unit.

FIG. 7 is a flowchart to show an example of the control to be performed by the temperature controller 21*b* of the control unit F1. The flowchart shown in FIG. 7 may be executed by software processing in the microcomputer implemented in the control unit F1. The temperature controller 21*b* of the control unit F1 performs, for example, the processing indicated by the flowchart, as will be described below, such that the temperature of the wavelength conversion element 5 is controlled to the optimal target temperature set by the optimal temperature setting unit 21*a*.

In order to control the temperature of the wavelength conversion element 5 to the target temperature, the temperature controller 21*b* of the control unit F1 uses the temperature detecting unit Th1 to detect the temperature of the wavelength conversion element 5 (temperature of the heat transfer plate 6 heated by the heater 7 in FIG. 1), and compares the detected temperature with the optimal set temperature (i.e., target temperature) to periodically adjust (control) the amount of electric power to be fed to the heater 7.

This control will be described with an example that uses the PI control scheme (combination of the proportional control and the integral control). The PI control scheme is a typical control scheme.

In FIG. 7, the heater control starts at Step B01. Firstly, the current temperature of the heat transfer plate 6 heated by the heater 7, i.e., an actually measured temperature value of the wavelength conversion element 5 (actual measurement value of PPLN temperature) is measured by the temperature detecting unit Th1 to obtain an actually measured temperature value (Tm_PPLN) at Step B02. The temperature of the heat transfer plate 6 has correlation with the temperature of the wavelength conversion element 5.

Subsequently at Step B03, the target temperature of the wavelength conversion element 5, i.e., the optimal temperature set value of the wavelength conversion element 5 (set value of the PPLN temperature), which is set by the optimal temperature setting unit 21*a* of the control unit F1 is read to obtain the optimal temperature set value (Ts_PPLN).

At Step B04, the optimal temperature set value (Ts_PPLN) is compared with the actually measured temperature value (Tm_PPLN) measured by the temperature detecting unit Th1 to obtain the difference (en) between the two temperatures. The difference (en) is used to perform the PI processing at Step B05. In the PI processing, an amount of electric power to be fed to the heater 7 (i.e., amount of control input to the heater 7) is obtained using the equation (I).

$$MVn = MVn-1 + Kp \times en + Ki \times en-1 \quad (I)$$

where MVn is an amount of control input at this time, MVn−1 is an amount of control input at a previous cycle, en is a temperature difference calculated at this time, en−1 is a temperature difference at the previous cycle, Kp is a constant, and Ki is a constant.

The amount of control input (MVn) calculated by the PI processing will be updated as the ON width of the PWM signal sent from the control unit F1. At Step B06, when the amount of control input (MVn) exceeds the maximum value (MVn upper limit), the maximum value is used as the amount of control input (MVn) at Step B09. At Step B07, when the amount of control input (MVn) is smaller than the minimum value (MVn lower limit), the minimum value is used as the amount of control input (MVn) at Step B08. This is the upper and lower limit restriction.

An ultimate amount of control input decided by Steps B06-B09 is used as the update value for the ON width (Duty (n)) of the PWM signal to be sent from the control unit F1 (Step B10), and then the heater control at this cycle is finished.

A series of processing from Steps B01 to B11 is repeated at the predetermined cycle. By periodically performing the flowchart of FIG. 7 to carry out the feedback control, the wavelength conversion element 5 is stably controlled to reach the optimal temperature.

It should be noted that although the control algorithm described here uses the PI control scheme that includes the proportional control and the integral control, another feedback control algorithm using, for example, a PID control scheme, which additionally includes a differential control, or other control schemes, may alternatively be employed.

A method of obtaining the optimal target temperature that maximizes the wavelength conversion efficiency of the wavelength conversion element in this embodiment will be described.

Firstly, the heat that influences the temperature (Tlsr) of the light source part will be described.

The light source part temperature (Tlsr) detected by the light source part temperature detecting unit Th2 disposed on or in the vicinity of the semiconductor laser 2 is influenced by various parameters such as the input electric power (Pinput) upon activating the laser, the cooling condition, the temperature of the heater associated with the wavelength conversion element (i.e., temperature (Tppln) of the wavelength conversion element 5) and the like.

When a plurality of laser light source units are implemented (installed, mounted) at a high density, the heat generated from the neighboring semiconductor laser may also influence the temperature (Tlsr) of the light source part 12 of the semiconductor laser apparatus. It is difficult to list all the parameters that would possibly influence the temperature (Tlsr) of the light source part 12, and therefore the following description uses a term "cooling condition (Tcool)" to collectively refer to all the thermal outside environment conditions, except for the input electric power (Pinput) upon turning on the laser, the wavelength conversion element temperature, and the heater temperature (Tppln). The "outside" means outside the laser light source unit package.

For example, when the cooling condition (Tcool) (e.g., all of the room temperature of an installation place of the laser light source apparatus, the temperature inside the housing of the laser light source unit, a preset water temperature of a laser chilling machine, and other conditions) is unchanged, and the input electric power (Pinput) fed upon turning on the laser is only changed, then the light source part temperature (Tlsr) increases as the input electric power (Pinput) fed upon turning on the laser increases. This is because heat generation from the laser element increases as the input electric power (Pinput) at the time of feeding electric power to the laser increases.

In another example, when the input electric power (Pinput) at the time of feeding electric power to the laser is unchanged, and the cooling condition (Tcool) is only changed (e.g., change in the atmosphere temperature), then the cooling efficiency drops as the cooling condition (Tcool) increases (e.g., the atmosphere temperature increases due to the change of the season). Then, an amount of heat discharge decreases, and the light source part temperature (Tlsr) rises.

In summary, the light source part temperature (Tlsr) can be expressed by Formula (1).

$$Tlsr = F1(Tcool, Pinput, Tppln) \quad (1)$$

Figure 8:
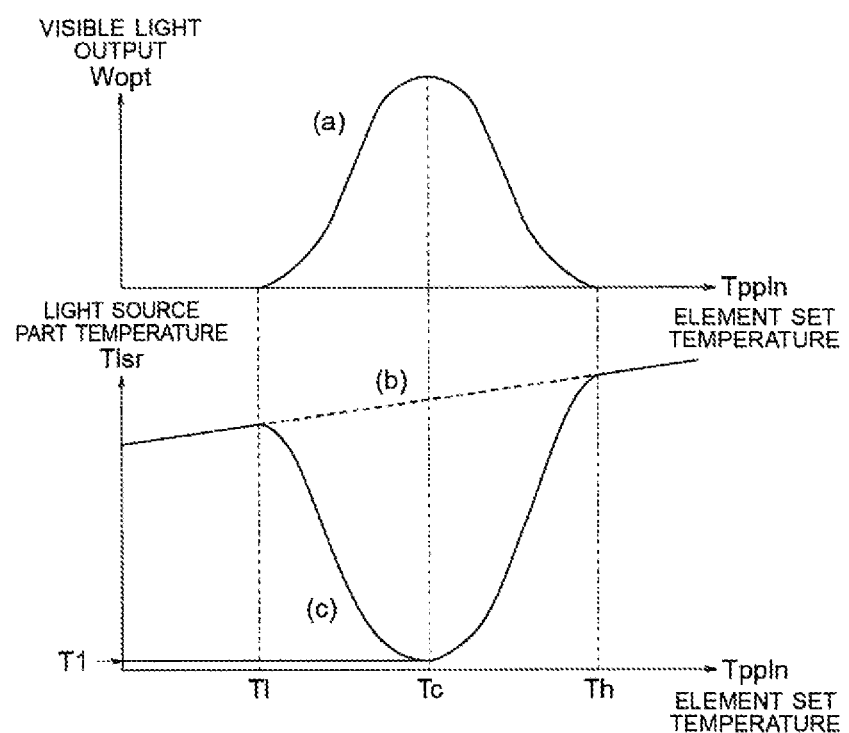
FIG. 8 is a pair of views, showing a visible light output from the laser light source with respect to the set temperature of the wavelength conversion element, and the temperature of the light source part with respect to the set temperature of the wavelength conversion element.

FIG. 8 is a pair of diagrams. The upper diagram shows a light output (Wopt) from the laser light source relative to the set temperature (Tppln) of the wavelength conversion element 5, and the lower diagram shows the temperature (Tlsr) of the light source part 12 relative to the set temperature (Tppln) of the wavelength conversion element 5. The horizontal axis of each diagram indicates the set temperature (Tppln) of the wavelength conversion element. The vertical axis of the upper diagram indicates the light output (Wopt), and the vertical axis of the lower diagram indicates the light source part temperature (Tlsr).

The curve (a) in FIG. 8 shows the visible light output Wopt relative to the set temperature (Tppln) of the wavelength conversion element when the cooling condition is held at a certain point (Tcool is unchanged) and a certain amount of electric power is constantly supplied upon turning on the laser (Pinput is unchanged).

The straight line (b) in FIG. 8 shows the expected temperature (Tlsr) of the light source part relative to the set temperature (Tppln) of the wavelength conversion element 5 when the cooling condition is held at a certain point (Tcool is unchanged) and a certain amount of electric power is constantly supplied upon turning on the laser (Pinput is unchanged). The influence on the temperature of the wavelength conversion element 5 is only taken into account for the sake of simplicity.

The curve (c) in FIG. 8 shows the actual temperature (Tlsr) of the light source part relative to the set temperature (Tppln) of the wavelength conversion element 5 when the cooling condition is held at a certain point (Tcool is unchanged) and a certain amount of electric power is constantly supplied upon turning on the laser (Pinput is unchanged).

As shown in FIG. 8, the light source part temperature (Tlsr) becomes minimum at the set temperature (Tppln) of the wavelength conversion element 5, at which the visible light output (Wopt) becomes maximum.

This will be described below.

When the set temperature (Tppln) of the wavelength conversion element 5 is fixed (set) to a certain temperature (Tppln=Tc), it is possible to convert the infrared light emitted from the semiconductor laser 2 of the light source part 12 to visible light at the maximum conversion efficiency, as indicated by the curve (a) in FIG. 8.

If an amount of input electric power (Pinput) to be supplied upon turning on the laser is unchanged, and the cooling condition is unchanged, the Formula (1) can be expressed as a function of the set temperature (Tppln) of the wavelength conversion element 5, as in the Formula (2).

$$Tlsr = F1(Tppln) \quad (2)$$

An amount of electric power to be supplied to the heater 7 increases as the set temperature (Tppln) of the wavelength conversion element 5 rises. Thus, the light source part temperature (Tlsr) is influenced by the increased amount of heat generation from the heater 7 (i.e., elevated temperature of the heater 7), which is caused by the increased amount of electric power supplied to the heater 7, and accordingly it is assumed that the light source part temperature (Tlsr) has a tendency of continuously rising. In other words, it is expected that the light source part temperature (Tlsr) behaves like a simply increasing function of the set temperature (Tppln) of the wavelength conversion element 5, as indicated by the broken line (b) in FIG. 8.

In reality, however, the light source part temperature does not change like the broken line (b) in FIG. 8, and rather behaves like the recess as indicated by the solid line (c) in FIG. 8. The light source part temperature becomes minimum at the set temperature (Tppln=Tc) of the wavelength conversion element at which the visible light output (Wopt) of the laser light source becomes maximum.

This phenomenon can be described in the following way. When the input electric power (Pinput) fed at the time of turning on the laser and the cooling condition (Tcool) are unchanged, certain infrared light is confined in the resonator in a temperature range which does not allow the wavelength conversion element 5 to convert the infrared light to the visible light. In this case, there is a heat input to the semiconductor laser 2 due to the infrared energy in the resonator.

In the set temperature range (Tppln=Tc) which allows the wavelength conversion element 5 to convert the infrared light to the visible light and the neighboring range, on the other hand, a majority of the infrared light emitted from the semiconductor laser 2 is converted to the visible light by the wavelength conversion element 5, and released out of the package of the laser light source unit LH. Accordingly, the heat input to the semiconductor laser 2 due to the infrared energy in the resonator decreases. It is assumed that because the amount of decrease in the heat input to the semiconductor laser 2 due to the infrared energy in the resonator is proportional to the amount of visible light released out of the package of the laser light source unit LH, the point (Tlsr=T1) at which the light source part temperature (Tlsr) becomes minimum coincides with the set temperature (Tppln=Tc) of the wavelength conversion element that maximizes the conversion efficiency of the wavelength conversion element. Therefore, the Formula (2) can be expressed by the Formula (3) when the temperature is the set temperature of the wavelength conversion element 5 (Tppln=Tc).

$$\left(\frac{\partial Tlsr}{\partial Tppln}\right) = 0 \quad (3)$$

and $$\left(\frac{\partial^2 Tlsr}{\partial^2 Tppln}\right) > 0$$

Figure 18:
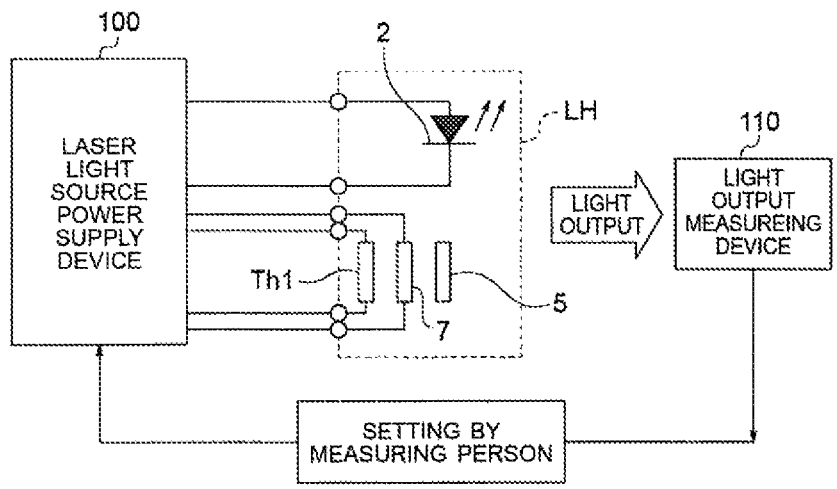
FIG. 18 is a block diagram of an example of conventional laser light source apparatuses.

When the light source part temperature (Tlsr) is measured (monitored) by the light source part temperature detecting unit Th2 located on the semiconductor laser 2 or in its vicinity, it becomes possible to set the temperature of the wavelength conversion element to the set temperature of the wavelength conversion element (Tppln=Tc) that maximizes the conversion efficiency to the visible light, without measuring the visible light output (Wopt) with the light output measuring device 110 such as an optical power meter (see FIG. 18). This decreases the number of parts and components, eliminates a device for measuring the visible light output, and contributes to the cost reduction.

Figure 9:
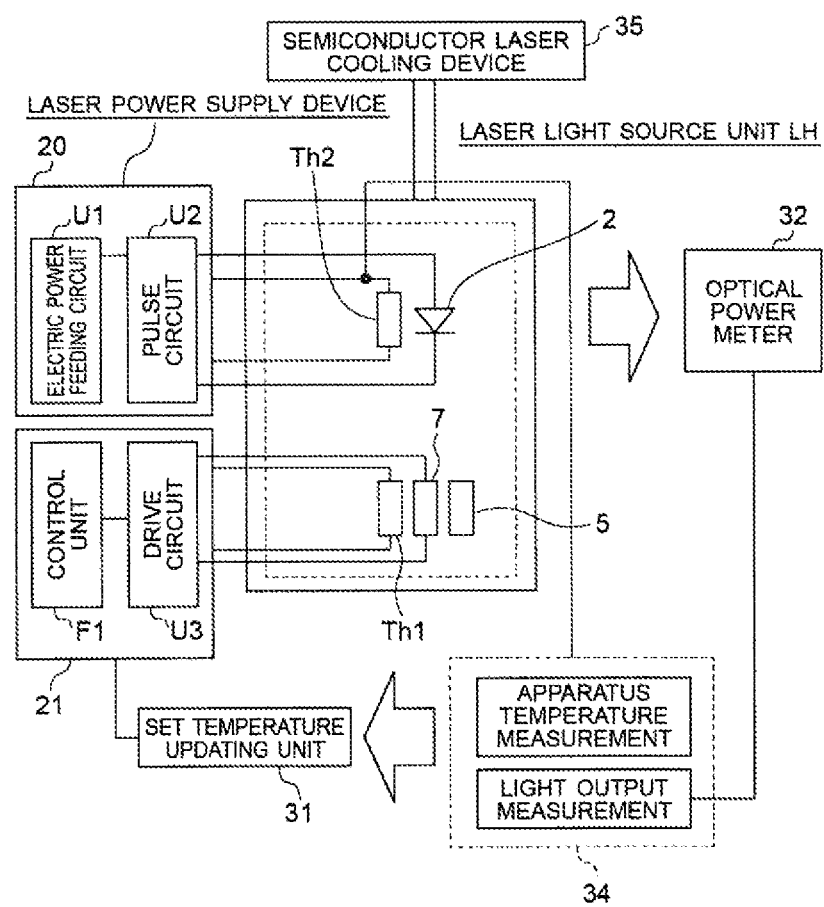
FIG. 9 shows an exemplary structure of an experimental device used to obtain the characteristic data of FIG. 8.

Referring now to FIG. 9, a method of measuring the visible light output (Wopt) relative to the set temperature of the wavelength conversion element 5, and measuring the light source part temperature to obtain the data shown in FIG. 8 will be described.

In FIG. 9, the reference sign "LH" designates the laser light source unit, the reference numeral 20 designates the power supply circuit, and the reference numeral 21 designates the control part of the set temperature (Tppln) of the wavelength conversion element 5. The control part 21 controls an amount of heating from the heater 7 and performs the feedback control to the set temperature of the wavelength conversion element 5 such that the temperature of the wavelength conversion element 5 (PPLN in this embodiment), which is detected by the element temperature detecting unit Th1, becomes the set temperature of the wavelength conversion element given from a set temperature updating unit 31.

The reference numeral 32 designates the optical power meter to measure the visible light output of the laser light source unit LH, and the reference numeral 34 designates a storage unit to store (record) the visible light output measured by the optical power meter 32 and the light source part temperature (Tlsr) detected by the temperature detecting unit Th2. The light output measured by the optical power meter 32 and the light source part temperature detected by the light source part temperature detecting unit Th2 are stored in the storage unit 34 and/or other units. The reference numeral 35 designates a semiconductor laser cooling device to cool the semiconductor laser 2 and other components.

Experimental conditions and an experimental method for obtaining the data shown in FIG. 8 are indicated below.

(1) The cooling condition (Tcool) (e.g., room temperature during the measurement) is fixed to, for example, 25.0 degrees C.

(2) The set temperature (Tppln) of the wavelength conversion element 5 is set to, for example, 80.0 degrees C. (The control part 21 performs the feedback control such that the temperature of the wavelength conversion element 5, which is detected by the element temperature detecting unit Th1, becomes the above-mentioned set temperature (e.g., 80.0 degrees C.).)

(3) During the measurement, nothing is done to change the surrounding environment, such as no turning on another laser in the vicinity of a measurement sample. The cooling condition (Tcool) is therefore maintained unchanged.

(4) The input electric power (Pinput) to be supplied to the semiconductor laser 2 at the time of turning on the semiconductor laser 2 is, for example, 50 W, and unchanged.

(5) The output value of the visible light (Wopt), which is obtained upon converting the light emitted from the laser light source unit LH to the visible light by the wavelength conversion element 5, is measured by the optical power meter 32.

(6) The light source part temperature (Tlsr) detected by the light source part temperature detecting unit Th2 is also measured.

(7) After the visible light output (Wopt) and the light source part temperature (Tlsr) detected by the temperature detecting unit Th2 are measured, the set temperature (Tppln) of the wavelength conversion element 5 is increased 0.1 degree C. by the set temperature updating unit 31. (For example, the set temperature is updated to 80.1 degrees C. The input electric power (Pinput) supplied at the time of turning on the laser is 50 W and unchanged.)

(8) When the temperature of the wavelength conversion element 5 becomes stable at the set temperature, the visible light output of the semiconductor laser (LD) is measured by the optical power meter 32, and the light source part temperature (Tlsr) detected by the light source part temperature detecting unit Th2 is measured.

The same process is repeated with the set temperature of the wavelength conversion element 5 being increased by 0.1 degree C. each time. The visible light output of when the temperature of the wavelength conversion element 5 becomes stable at the set temperature is measured, and the light source part temperature (Tlsr) detected by the temperature detecting unit Th2 is measured. This series of operations continue until the set temperature of the wavelength conversion element 5 reaches a predetermined maximum value of the set temperature (e.g., 100.0 degrees C.).

By repeating these operations, it is possible to collect data of the light source part temperature (Tlsr) detected by the temperature detecting unit Th2 and the visible light output (Wopt) measured by the optical power meter 32 in the temperature range of the wavelength conversion element 5 between 80 and 100 degrees C.

Then, the relationship between the temperature (Tppln) of the wavelength conversion element 5 and the obtained visible light output (Wopt) from the laser light source unit LH, together with the light source part temperature (Tlsr) detected by the light source part temperature detecting unit Th2 is plotted to obtain the characteristic curves shown in FIG. 8.

The embodiment of the present invention can obtain an optimal temperature (Tc) without using a separate device for measuring light, i.e., without incurring an unnecessary cost, and therefore can enjoy the expected advantages.

If a plurality of or a large number of laser light source units LH are used to assemble a single product (e.g., a large projection system), and the measurement is performed for each of the laser light source units, then a considerably long time is needed for adjustment. According to the embodiment of the present invention, on the other hand, even if a plurality of laser light source units are used, the optimal temperature for the respective laser light source units can be searched (found) simultaneously. This results in a significant reduction in the measurement work time, and provides the expected advantages of the embodiment of the present invention.

Figure 19:
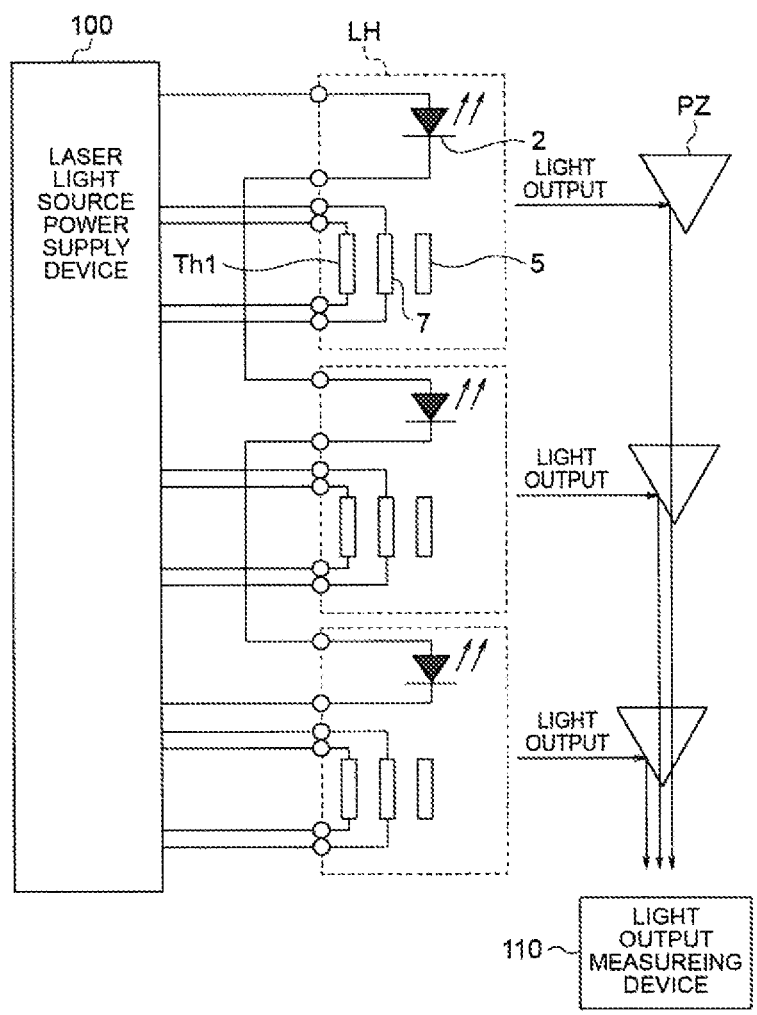
FIG. 19 is a block diagram of another example of the conventional laser light source apparatus that has a plurality of laser elements connected in series.

In addition, the embodiment of the present invention need not to measure the light output emitted, even if the circuitry includes the laser diodes of the semiconductor lasers 2 connected in series (e.g., the circuitry shown in FIG. 19). Thus, it is possible to easily find the optimal temperature, and can enjoy the expected advantages of this embodiment.

Figure 10:
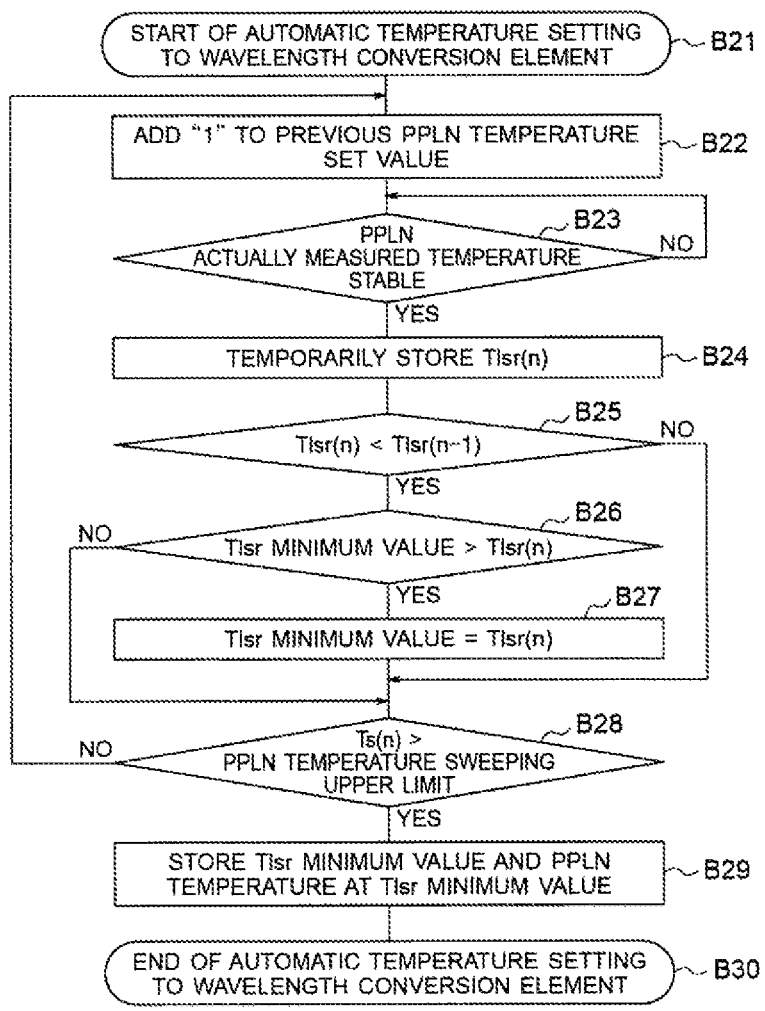
FIG. 10 is a flowchart of the processing (Example 1) for detecting the optimal set temperature of the wavelength conversion element.

FIG. 10 is a flowchart of the processing (Example 1) for detecting the optimal set temperature of the wavelength conversion element 5, which is carried out by the optimal temperature setting unit 21a of the control unit F1 of the control part 21 shown in FIG. 2. The flowchart of FIG. 10 may be executed by the processing of the microcomputer implemented in the control unit F1. The optimal temperature setting unit 21a executes this flowchart to set the optimal set temperature of the wavelength conversion element 5. In the flowchart shown in FIG. 10, the light source part temperature (Tlsr) is detected by the light source part temperature detecting unit Th2 while the set temperature (Tppln) of the wavelength conversion element 5 is being gradually changed. The temperature of the wavelength conversion element 5 of when the light source part temperature (Tlsr) becomes minimum is taken as the optimal set temperature (Tppln_opt).

The optimal set temperature of the wavelength conversion element 5 will be decided and set as follows.

At Step B21, a signal to start the process for automatically setting the wavelength conversion element temperature is entered. Thus, the temperature automatic setting process starts.

At Step B22, "1" is added to the measured temperature value (PPLN temperature set value: Tppln) of the wavelength conversion element 5, which is measured at the previous measurement. In other words, the temperature is set to the temperature (Ts(n)) of the next step. For example, if the measured temperature value of the previous measurement is 90.0 degrees C. and the temperature increase at each step is 0.1 degree C., then the set temperature becomes 90.1 degrees C.

At Step B23, the temperature of the wavelength conversion element 5 is actually measured, and it is determined whether the wavelength conversion element temperature is stable or not.

At Step B24, the light source part temperature (Tlsr(n)) is temporarily stored, when the temperature of the wavelength conversion element 5 (actually measured temperature value of the PPLN) becomes stable at the set temperature.

At Step B25, the light source part temperature (Tlsr(n)) at the set temperature of the wavelength conversion element 5 at this measurement is compared with the light source part temperature (Tlsr(n−1)) of when the temperature is stable at the set temperature of the wavelength conversion element 5 at the previous measurement. When the light source part temperature (Tlsr(n)) at this measurement is greater than the light source part temperature at the previous measurement, the processing jumps to Step B28.

At Step B26, when the light source part temperature (Tlsr(n)) at this measurement is smaller than the light source part temperature at the previous measurement, then it is determined whether the light source part temperature (Tlsr(n)) at this measurement is smaller than the minimum value (Tlsr minimum value) of the light source part temperature. The Tlsr minimum value is set to a value that is greater than an actual minimum value of the light source part temperature beforehand by initial setting. When the light source part temperature at this measurement is greater than the minimum value of the light source part temperature, the processing jumps to Step B28.

When the light source part temperature at this measurement is smaller than the minimum value of the light source part temperature, the light source part temperature (Tlsr(n)) at this measurement is taken as the minimum value (Tlsr minimum value), and newly registered at Step B27.

At Step B28, the upper limit value (PPLN temperature upper limit value) of the temperature sweeping range (e.g., 80-100 degrees C.) of the wavelength conversion element 5, which is decided in advance, is compared with the temperature Ts(n) of the next step (next measurement) from the measured temperature value of the wavelength conversion element, which is set at this measurement.

When the set temperature Ts(n) does not reach the upper limit value of the sweeping temperature, the processing returns to Step B22 and repeat the above-described Steps.

At Step B29, when the temperature Ts(n) reaches the upper limit value of the sweeping temperature, the minimum value (Tlsr minimum value) of the light source part temperature at this point is stored (recorded). Then, the temperature of the wavelength conversion element 5 (PPLN temperature) at the minimum value (Tlsr minimum value) is set as the optimal temperature of the wavelength conversion element 5.

At Step B30, the automatic setting of the wavelength conversion element temperature is finished as the optimal temperature of the wavelength conversion element 5 is decided.

By performing the processing in accordance with the above-described flowchart, it is possible to detect and set the optimal temperature of the wavelength conversion element 5 without monitoring the visible light output that can make the curve (c) reach the minimum value in FIG. 8 (i.e., visible light output at the temperature Tc).

Figure 11:
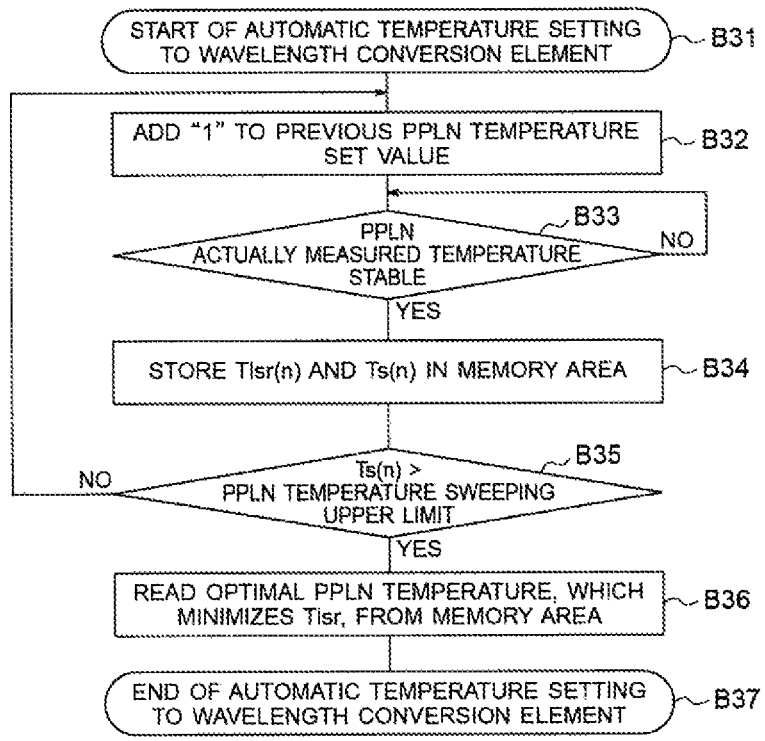
FIG. 11 is a flowchart of another processing (Example 2) for detecting the optimal set temperature of the wavelength conversion element.

FIG. 11 is a flowchart of another processing (Example 2) for detecting the optimal set temperature of the wavelength conversion element 5, which is carried out by the optimal temperature setting unit 21a of the control unit F1.

At Step B31, a signal to start the process for automatically setting the wavelength conversion element temperature is entered. Thus, the temperature automatic setting process starts.

At Step B32, "1" is added to the measured temperature value (PPLN temperature set value) of the wavelength conversion element 5, which is measured at the previous measurement. In other words, the temperature is set to the temperature (Ts(n)) of the next step. For example, if the measured temperature value of the previous measurement is 90.0 degrees C. and the temperature increase at each step is 0.1 degree C., then the set temperature becomes 90.1 degrees C.

At Step B33, the temperature of the wavelength conversion element 5 is actually measured, and it is determined whether the wavelength conversion element temperature is stable or not.

At Step B34, the light source part temperature (Tlsr(n)) and the wavelength conversion element set temperature (Ts(n)) are temporarily stored in a memory area of the microcomputer or the like, when the temperature of the wavelength conversion element 5 becomes stable.

At Step B35, the set temperature (Ts(n)) is increased one step by one step until the set temperature reaches the upper limit value (PPLN temperature sweeping upper limit value) of the temperature sweeping range (e.g., 80-100 degrees C.) of the wavelength conversion element 5, which is decided in advance. Thus, the above-mentioned steps are repeated (Step B35→Steps B32-B34) to accumulate the data in the memory area. All these data are stored in the memory area.

At Step B36, the minimum value of the light source part temperature is read from the entire data stored in the memory area.

At Step B37, the wavelength conversion element temperature that minimizes the light source part temperature is taken as (set as) the optimal temperature (PPLN temperature) of the wavelength conversion element 5.

The processing performed by the temperature controller 21b as shown in FIG. 7, and the detection of the optimal set temperature of the wavelength conversion element 5 performed by the optimal temperature setting unit 21a as shown in FIG. 10 or FIG. 11 are carried out at the following timing.

For example, before shipping the laser light source apparatus, the optimal set temperature value of the wavelength conversion element 5 is obtained and stored by the procedure shown in the flowchart of FIG. 10 or FIG. 11. When the laser light source apparatus is operated with no change in the environment condition, the processing shown in the flowchart of FIG. 7 is executed with this set value to control the temperature of the wavelength conversion element 5.

If the environment condition changes, e.g., if the surrounding temperature of the semiconductor laser 2 changes as will be described, the optimal temperature of the wavelength conversion element 5 also changes. Thus, the set temperature value is appropriately updated to another optimal set value in response to the changing environment condition by executing the processing shown in FIG. 10 or FIG. 11.

It should be noted that the processing for obtaining the optimal set temperature may be performed before starting the first operation of the day, when the season changes, once a month, or once a week. In other words, the processing for obtaining the optimal set temperature may be performed by periodic (scheduled) calibration or maintenance. Alternatively, the processing for obtaining the optimal set temperature may be performed when the semiconductor laser 2 is replaced.

As described above, the light output from the laser light source apparatus greatly depends upon the temperature of the wavelength conversion element 5 because of the characteristics of the laser light source apparatus. In order to obtain high conversion efficiency in the wavelength conversion element 5, the extremely precise control should be performed on the temperature of the wavelength conversion element 5. However, the optimal temperature to obtain the high conversion efficiency may gradually change with the operating environment such as the surrounding temperature of the semiconductor laser 2, the temperature of an external resonator if the laser light source apparatus is equipped with the external resonator, and other lighting conditions. This gradual change in the optimal temperature may occur even while the laser light source apparatus is being lit.

For example, when the installation position of the laser light source apparatus is changed or when the surrounding temperature changes due to the change of the season, the optimal temperature changes. Every time such change occurs, it is necessary to find (obtain) the optimal set temperature for setting the optimal temperature of the wavelength conversion element.

The following description deals with the change in the optimal temperature (Tppln_opt) of the wavelength conversion element 5 when the cooling condition (Tcool) and/or the laser input condition (Pinput) changes.

The visible light output (Wopt) from the laser light source apparatus greatly relies upon the temperature of the wavelength conversion element 5 and the temperature of an active layer of the semiconductor laser 2. If the laser light source apparatus is equipped with the external resonator (e.g., VBG or Volume Bragg Grating) for selecting the infrared light having a prescribed wavelength and reflecting the selected infrared light toward the semiconductor laser 2, the visible light output (Wopt) from the laser light source apparatus greatly relies upon the temperature of the external resonator.

The phase matching wavelength changes as the wavelength conversion element temperature changes. Thus, when the wavelength conversion element temperature changes, the conversion efficiency for converting the infrared light having a certain wavelength to the visible light significantly changes.

When the temperature of the active layer of the semiconductor laser 2 changes, an oscillation (emission) wavelength changes due to the temperature dependency of the refractive index of the material of the semiconductor laser 2, thermal expansion, and the like. Normally, the oscillation wavelength shifts to a longer wavelength as the temperature rises.

Likewise, when the temperature of the external resonator changes, the wavelength of the infrared light to be selected and reflected also changes, due to the temperature dependency of the refractive index and/or the thermal expansion. In this case also, the selected and reflected wavelength, i.e., the oscillation wavelength of the laser equipped with the external resonator, normally shifts to a longer wavelength as the temperature rises.

In other words, it is necessary to control the temperature of the wavelength conversion element such that high conversion efficiency is obtained at the oscillation wavelength corresponding to the temperature of the semiconductor laser and the external resonator. Thus, the control at extremely high precision is required.

Because the oscillation wavelength has the temperature dependency, the optimal temperature of the wavelength conversion element (Tppln_opt) for obtaining the high conversion efficiency to the visible light may gradually vary even while the laser light source apparatus is emitting the light, due to the change in the lighting condition (power supply condition) of the laser light source apparatus.

For example, a case where the cooling condition (Tcool) is unchanged and the input electric power (Pinput) to be fed upon turning on the laser only changes will be described below.

Figure 12:
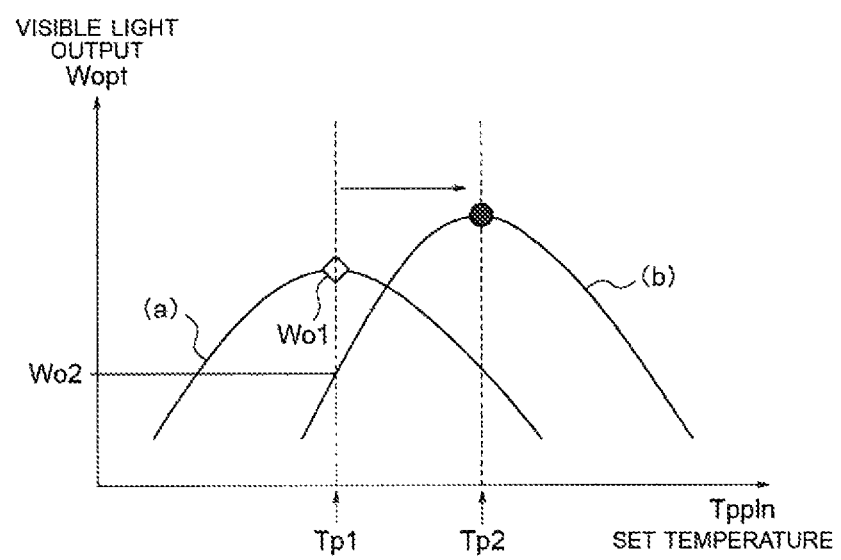
FIG. 12 depicts relationship between the set temperature of the wavelength conversion element and the visible light output.

FIG. 12 shows exemplary relationship between the visible light output (Wopt) and the set temperature (Tppln) of the wavelength conversion element.

The solid line (a) in FIG. 12 plots the visible light output (Wopt) when the set temperature (Tppln) of the wavelength conversion element 5 changes, with the input electric power (Pinput) upon turning on the laser being at a value Pi1, as described with reference to FIG. 8. The solid line (b) in FIG. 12 plots the visible light output (Wopt) when the set temperature (Tppln) of the wavelength conversion element 5 changes, with the input electric power (Pinput) fed upon turning on the laser being at a value Pi2.

If the input electric power (Pinput) upon turning on the laser changes from a value Pi1 to a value Pi2, the optimal temperature (Tppln_opt) of the wavelength conversion element 5 that makes the visible light output maximum changes from temperature Tp1 (◇) to temperature Tp2 (•). (The light output drops to a value Wog if the set temperature of the wavelength conversion element is kept at the temperature Tp1.)

Therefore, it is possible to obtain an optimal wavelength conversion characteristic by setting the set temperature (Tppln) of the wavelength conversion element 5 to the temperature Tp2.

Next, relationship among the optimal set temperature (Tppln_opt) of the wavelength conversion element, the light source part temperature (Tlsr) and the input electric power (Pinput) to cause the laser to light will be described. FIG. 13 shows the relationship between the optimal set temperature (Tppln_opt) and the light source part temperature (Tlsr), and the relationship between the optimal set temperature (Tppln_opt) and the input electric power (Pinput) to cause the laser to light.

In order to have the above-mentioned relationships, experiments were carried out with the arrangement shown in FIG. 9 in the following manner.

First Example

The input electric power (Pinput) fed to the semiconductor laser 2 upon turning on the semiconductor laser 2 is unchanged (e.g., the input electric power is 55 W and unchanged), and the cooling condition (Tcool) is changed (e.g., the set value of the semiconductor laser cooling device 35 is only changed 1 degree C. at a time in the range between 10 degrees C. and 40 degrees C.). At every set value of the semiconductor laser cooling device 35, the set temperature (Tppln) of the wavelength conversion element 5 is changed 0.1 degree C. at a time, and the light source part temperature (Tlsr) is measured each time. Because it is known that the point that makes the light source part temperature (Tlsr) minimum coincides with the set temperature (Tppln_opt) of the wavelength conversion element that maximizes the visible light conversion efficiency of the wavelength conversion element, the set temperature (Tppln_opt) of the wavelength conversion element that makes the light source part temperature (Tlsr) minimum is sought (obtained) at every set value of the semiconductor laser cooling device 35.

Figure 13A:
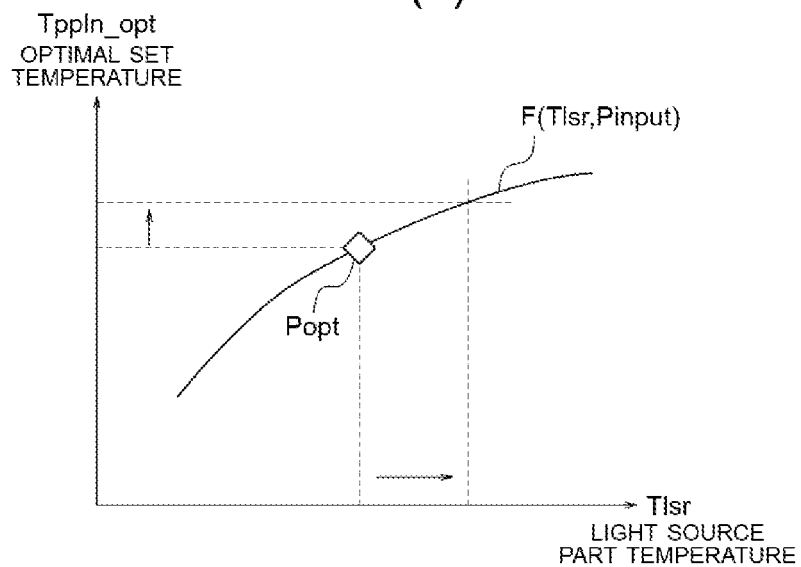
FIG. 13(*a*) is a view to depict relationship between the light source part temperature and the optimal set temperature of the wavelength conversion element.
Figure 13B:
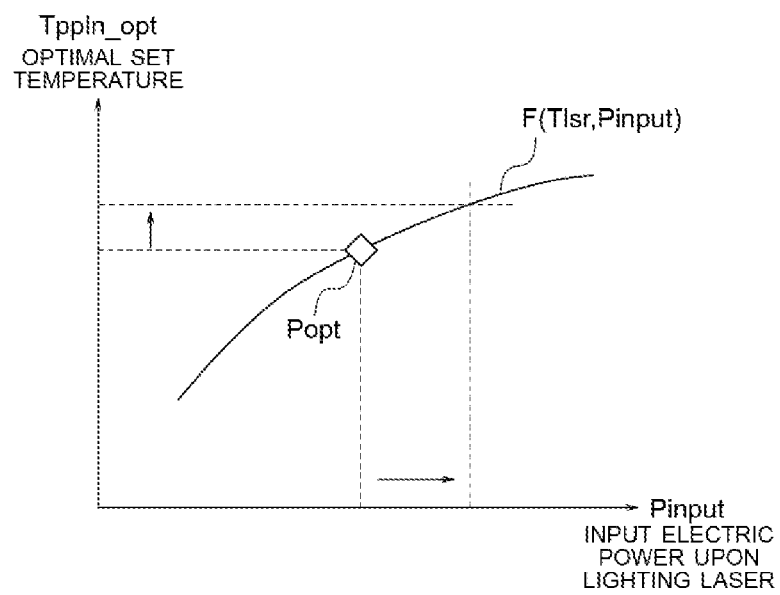

Based on the results obtained in the above-described way, the relationship between the light source part temperature (Tlsr) and the optimal temperature (Tppln_opt) of the wavelength conversion element is plotted to obtain the characteristic curve shown in FIG. 13(a). As depicted in this drawing, the optimal set temperature (Tppln_opt) of the wavelength conversion element rises as the light source part temperature (Tlsr) rises (as indicated by the arrows in FIG. 13(a)).

Second Example

The cooling condition (Tcool) is unchanged (e.g., the set value of the semiconductor laser cooling device 35 is 20 degrees C. and unchanged), and the input electric power (Pinput) fed to the semiconductor laser 2 upon turning on the semiconductor laser 2 is changed, for example, 5 W at a time in the range between 40 W and 70 W. At every feeding of electric power (Pinput) to turn on the laser, the set temperature (Tppln) of the wavelength conversion element 5 is changed 0.1 degree C. at a time, and the light source part temperature (Tlsr) is measured each time. Because the point that makes the light source part temperature (Tlsr) minimum coincides with the optimal set temperature (Tppln_opt) of the wavelength conversion element 5 that maximizes the visible light conversion efficiency of the wavelength conversion element 5, the set temperature (Tppln_opt) of the wavelength conversion element 5 that makes the light source part temperature (Tlsr) minimum is sought (obtained) at every feeding of the electric power (Pinput) to turn on the laser. Based on the obtained results, the relationship between the input electric power (Pinput) fed upon turning on the laser and the optimal set temperature (Tppln_opt) of the wavelength conversion element 5 is plotted to obtain the characteristic curve shown in FIG. 13(b). As depicted in this drawing, the optimal set temperature (Tppln_opt) of the wavelength conversion element rises as the input electric power (Pinput) upon turning on the laser increases (as indicated by the arrows in FIG. 13(b)).

Further, it is possible to obtain the relationship between the light source part temperature (Tlsr) and the optimal set temperature (Tppln_opt) in a desired range and between the input electric power (Pinput) upon turning on the laser and the optimal set temperature (Tppln_opt) in a desired range if the light source part temperature (Tlsr), the input electric power (Pinput) upon turning on the laser, and the optimal set temperature (Tppln_opt) of the wavelength conversion element are measured, with the input electric power to the semiconductor laser (laser diode) 2 being maintained at a set value different from the First Example, or the cooling condition being maintained at a set value different from the Second Example, and then the relationships are plotted.

Table 1 shows the relationship among the light source part temperature (Tlsr), the input electric power (W) (Pinput) upon turning on the laser, and the optimal set temperature (Tppln_opt), which is obtained in the above-described manner.

TABLE 1

| | | Electric Power (W) Fed to Turn On Laser | | | |
|---|---|---|---|---|---|
| | | 40 | 40 | 40 | 40 |
| Light Source Part Temp (degrees C.) | 25.0 | 79.4 | 79.9 | 80.4 | 80.9 |
| | 30.0 | 79.9 | 80.4 | 80.9 | 81.4 |
| | 35.0 | 80.4 | 80.9 | 81.4 | 81.9 |
| | 40.0 | 80.9 | 81.4 | 81.9 | 82.4 |
| | 45.0 | 81.4 | 81.9 | 82.4 | 82.9 |

Figure 14:
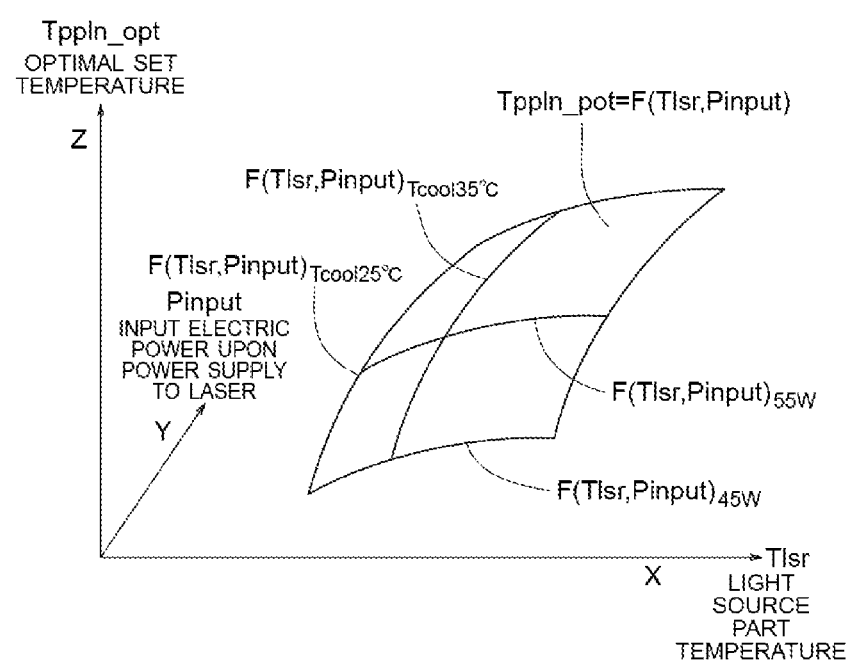
FIG. 14 is a characteristic diagram in the form of three-dimensional graph, showing the relationship among the light source part temperature, the electric power supplied upon turning on (activating) the laser, and the optimal set temperature of the wavelength conversion element.

FIG. 14 is a characteristic diagram, shown by the three-dimensional graph having X, Y and Z axes, as obtained in the above-described manner. In FIG. 14, the X axis indicates the light source part temperature (Tlsr), the Y axis indicates the input electric power (Pinput) upon turning on the laser, and the Z axis indicates the optimal set temperature (Tppln_opt). In FIG. 14, the point F(Tlsr, Pinput)$_{55W}$, for example, represents the optimal set temperature (Tppln_opt) when the input electric power (Pinput) upon turning on the laser is 55 W.

This relationship can be expressed by the Formula (4) below.

$$Tppln\_opt = F2(Tlsr, Pinput) \quad (4)$$

As described above, the light conversion characteristic of the wavelength conversion element 5 shifts in response to the change(s) in the surrounding environment or the like.

In the embodiment of the present invention, the optimal set temperature is calculated by the Formula (4) as the surrounding environment or the like changes, to control the temperature of the wavelength conversion element 5.

It should be noted that respective data may be stored in a memory, and the heater set temperature may be controlled using corresponding data from the data table, rather than calculating the optimal set temperature with the function of the Formula (4) every time.

Figure 15:
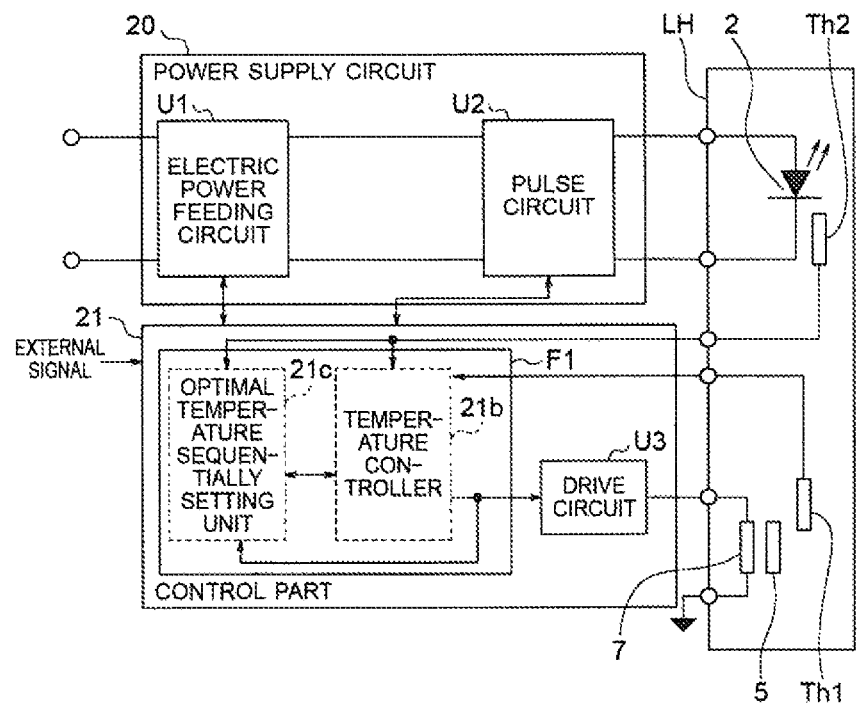
FIG. 15 is a block diagram showing a configuration of a control part and a power supply circuit of the laser light source apparatus according to a second embodiment of the present invention.

FIG. 15 is a block diagram showing a structure of a control part and a power supply circuit in a laser light source apparatus according to a second embodiment of the present invention. The second embodiment is configured to control the set temperature of the wavelength conversion element in response to variations in the surrounding environment, as described above.

The differences from the structure shown in FIG. 2 lie in that the control unit F1 has an optimal temperature sequentially setting unit 21c in place of the optimal temperature setting unit 21a, and the procedure for detecting the optimal set temperature is different from that of the first embodiment. Other structures and operations are the same as those described in the first embodiment.

Specifically, the power supply circuit 20 has the electric power feeding circuit U1 and the pulse circuit U2 for feeding the pulse electric power, as described in the first embodiment. The power supply circuit 20 sends to the semiconductor laser 2 the voltage and current that conform to the operating condition of the semiconductor laser 2 or the lighting sequence.

In order to convert the infrared light, emitted from the semiconductor laser 2, to visible light, there is provided the wavelength conversion element 5 (e.g., PPLN) for wavelength conversion. Also, the heater 7 for heating the wavelength conversion element 5, and the temperature detecting unit Th1 are provided.

The control part 21 has the control unit F1, and the drive circuit U3 for driving the heater 7. The electric power feeding circuit U1 and the pulse circuit U2 are controlled by the control unit F1.

The control unit F1 has the optimal temperature sequentially setting unit 21c, and the temperature controller 21b.

The temperature controller 21b controls an amount of electric power to be fed to the heater 7 based on the difference between the temperature detected by the temperature detecting unit Th1 and the set temperature set by the optimal temperature setting unit 21c, as shown in the flowchart of FIG. 7 such that feedback control is performed to cause the wavelength conversion element temperature to become the set temperature.

When the apparatus temperature (i.e., the surrounding temperature of the semiconductor laser) is detected, the optimal temperature sequentially setting unit 21c obtains the set temperature (or its correction value) of the wavelength conversion element that corresponds to the detected apparatus temperature by using the function, the table or the like at fixed intervals, so as to set (decide) the optimal set temperature. The optimal temperature sequentially setting unit 21c sends this optimal set temperature to the temperature controller 21b. The temperature controller 21b controls the temperature of the wavelength conversion element 5 such that the temperature of the wavelength conversion element 5 becomes the set temperature.

In other words, the optimal temperature sequentially setting unit 21c causes the set temperature to change when the wavelength conversion element 5 is irradiated with the laser beam at a certain light source part temperature. The optimal temperature sequentially setting unit 21c measures the light source part temperature at every set temperature, and obtains the temperature that makes the light source part temperature minimum. The optimal temperature sequentially setting unit 21c then takes this temperature as the first optimal set temperature of the wavelength conversion element at the above-mentioned light source part temperature. The optimal temperature sequentially setting unit 21c calculates a set temperature correction value to the optimal set temperature, with the light source part temperature and the electric power condition applied to the laser being parameters. Based on this correction value, the optimal temperature sequentially setting unit 21c updates the set temperature to the optimal set temperature sequentially at fixed intervals.

Figure 16:
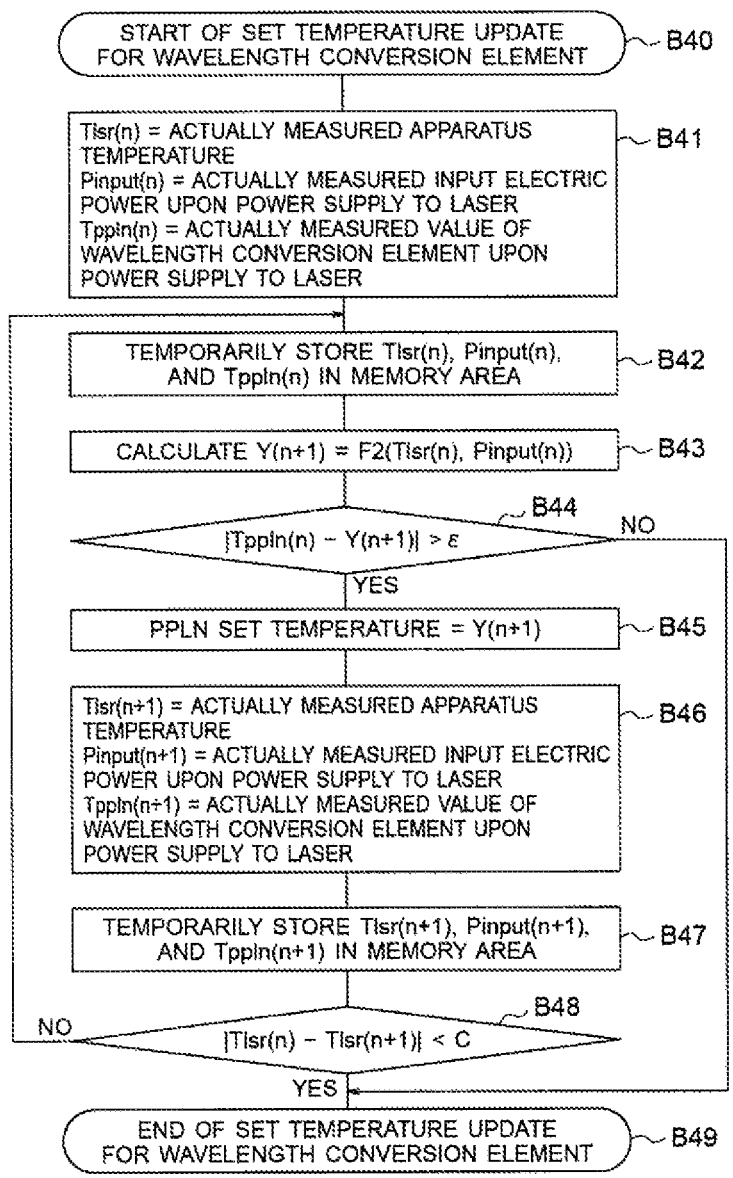
FIG. 16 is a flowchart of exemplary processing performed by an optimal temperature sequentially setting unit in the second embodiment of the present invention.

FIG. 16 is a flowchart showing one example of the control operation performed by the optimal temperature sequentially setting unit 21c of the control unit F1 according to the second embodiment of the present invention.

Referring to FIG. 16, an exemplary processing for updating the optimal set temperature in response to the changes in the light source part temperature and in the electric power condition to be applied to the laser will be described.

At Step B40, the set temperature updating process for the wavelength conversion element starts. At Step B41, the light source part temperature (Tlsr(n)) is obtained (measured) by the light source part temperature detecting unit Th2, the input electric power (Pinput(n)) upon turning on the laser is obtained (measured), and the temperature (Tppln(n)) of the wavelength conversion element is obtained (measured) by the element temperature detecting unit Th1.

At Step B42, the light source part temperature (Tlsr(n)), the input electric power (Pinput(n)) upon turning on the laser, and the wavelength conversion element temperature (Tppln(n)), which are all measured at Step B41, are temporarily stored in a memory area of, for example, the microcomputer.

At Step B43, the light source part temperature (Tlsr(n)) and the input electric power (Pinput(n)) upon turning on the laser, which are stored at Step B42, are substituted in the function F2(Tlsr, Pinput) (see the Formula (4)) stored in the storage device of the control unit F1 in advance, and the calculation is performed to obtain the optimal temperature (Y(n+1)) of the wavelength conversion element that maximizes the visible light output from the semiconductor laser.

At Step B44, the difference between the wavelength conversion element temperature (Tppln(n)) stored at Step B42 and the wavelength conversion element optimal temperature (Y(n+1)) calculated at Step B43 is compared with a predetermined threshold E. When this difference is smaller than the threshold E, the processing jumps to Step B49. When this difference is greater than the threshold E, the processing proceeds to Step B45.

At Step B45, the optimal temperature (Y(n+1)) of the wavelength conversion element obtained at Step B43 is set to the target value (set temperature) of the wavelength conversion element 5.

At Step B46, the light source part temperature (Tlsr(n+1)) is newly obtained (measured) by the light source part temperature detecting unit Th2, the input electric power (Pinput (n+1)) upon turning on the laser is newly obtained (measured), and the temperature (Tppln(n+1)) of the wavelength conversion element is newly obtained (measured) by the light source part temperature detecting unit Th2.

At Step B47, the light source part temperature (Tlsr(n+1)), the input electric power (Pinput(n+1)) upon turning on the laser, and the wavelength conversion element temperature (Tppln(n+1)), which are all measured at Step B46, are temporarily stored in a memory area of, for example, the microcomputer.

At Step B48, the difference between the light source part temperature (Tlsr(n)) stored at Step B42 and the light source part temperature (Tlsr(n+1)) measured at Step B46 is compared with a predetermined threshold C. When this difference is smaller than the threshold C, the processing proceeds to Step B49. When this difference is greater than the threshold C, the processing jumps to Step B42. At Step B49, the updating process for the set temperature is finished.

Preferably this embodiment is applied to the case where the cooling condition (Tcool) and the input electric power (Pinput) upon turning on the laser gradually change from the start of electric power feeding, the case where the cooling condition (Tcool) and the input electric power (Pinput) upon turning on the laser changes relatively quickly, and a similar case. A series of processing in this embodiment is carried out at fixed intervals while the laser is being lit (preferably once per one second to one minute).

In the apparatus shown in FIG. 15, when the cooling condition (Tcool) and/or the input electric power (Pinput) upon turning on the laser changes, the optimal set temperature (Tppln_opt) of the wavelength conversion element is correspondingly and automatically updated. It is assumed that the light source part temperature (Tlsr) and the optimal set temperature (Tppln_opt) gradually shift (e.g., the light source part temperature (Tlsr) changes as the input electric power (Pinput) upon turning on the laser changes, and correspondingly the optimal set temperature (Tppln_opt) changes), and they settle to the optimal set temperature (Tppln_opt) after a certain time elapses.

Figure 17:
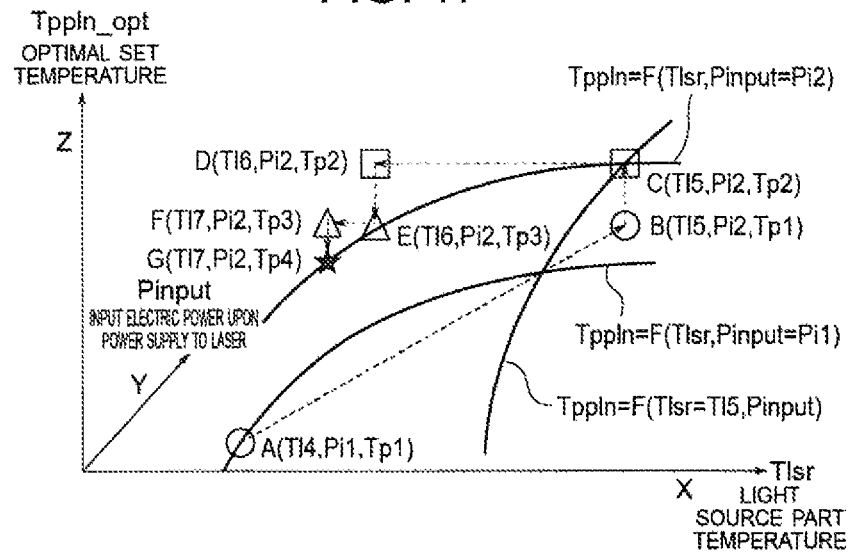
FIG. 17 is a view useful to describe how the light source part temperature and the optimal set temperature actually shift when the environment condition and other conditions change.

How the light source part temperature (Tlsr) and the optimal set temperature (Tppln_opt) actually shift when the environmental condition or the like changes will be described with reference to an operation example shown in FIG. 17. In FIG. 17, the X axis indicates the light source part temperature (Tlsr), the Y axis indicates the input electric power (Pinput) upon turning on the laser, and the Z axis indicates the optimal set temperature (Tppln_opt). The curves, which are drawn by the solid lines in FIG. 17, indicate the set temperature (Tppln) of the wavelength conversion element, with the light source part temperature (Tlsr) and the input electric power (Pinput) to turn on the laser being the parameters.

(1) The light source part temperature detecting unit Th2 detects that the optimal set temperature (Tppln_opt) of the wavelength conversion element 5 is a value Tp1 and the light source part temperature (Tlsr) is a value Tl4. The semiconductor laser (laser diode) 2 is lit, with the input electric power (Pinput) to turn on the laser being the value Pi1 (Point A in FIG. 17).

(2) The input electric power (Pinput) to turn on the laser is artificially changed to the value Pi2 (Point B in FIG. 17).

(3) The control part 21 detects that the input electric power (Pinput) to turn on the laser is the value Pi2.

(4) When the input electric power (Pinput) to turn on the laser increases, the heat generation of the laser element increases, and therefore the temperature in the vicinity of the semiconductor laser 2 rises.

(5) The light source part temperature detecting unit Th2 detects that the light source part temperature (Tlsr) rises to the value Tl5.

(6) The processing device such as the microcomputer of the control part 21 uses the stored Formula (4) to obtain the optimal set temperature (Tppln_opt)Tp2 of the wavelength conversion element 5 when (Tlsr, Pinput)=(Tl5, Pi2) is established. The processing device then alters the control target value of the temperature of the wavelength conversion element 5 to the value Tp2.

Upon altering the target value, the control part increases an amount of electric power to be fed to the heater, and performs the PID control such that the actually measured temperature of the wavelength conversion element 5 approaches the value Tp2 (Point B→Point C in FIG. 17).

(7) As the actually measured temperature of the wavelength conversion element 5 becomes closer to the value Tp2, the majority of the infrared light emitted from the semiconductor laser 2 is converted to the visible light by the wavelength conversion element 5, and the visible light is released out of the package of the laser light source unit LH. Accordingly, the heat input to the semiconductor laser 2 due to the infrared energy inside the resonator decreases. Thus, the light source part temperature (Tlsr) drops.

(8) The control part 21 uses the light source part temperature detecting unit Th2 to detect that the light source part temperature (Tlsr) drops to the value Tl6 (Point D in FIG. 17).

(9) The processing device such as the microcomputer of the control part 21 uses the stored Formula (4) to newly obtain the optimal temperature (Tppln_opt)Tp3 of the wavelength conversion element 5 when (Tlsr, Pinput)=(Tl6, Pi2) is established. The processing device then alters the control target value of the temperature of the wavelength conversion element 5 to the value Tp3.

(10) Upon altering the target value, the control part alters an amount of electric power to be fed to the heater 7, and performs the PID control such that the actually measured temperature of the wavelength conversion element 5 approaches the value Tp3.

(11) As the actually measured temperature of the wavelength conversion element 5 becomes closer to the value Tp3, the majority of the infrared light emitted from the semiconductor laser 2 is converted to the visible light by the wavelength conversion element 5, and the visible light is released out of the package of the laser light source unit LH. Accordingly, the heat input to the semiconductor laser 2 due to the infrared energy inside the resonator decreases. Thus, the light source part temperature (Tlsr) drops.

(12) The control part 21 uses the light source part temperature detecting unit Th2 to detect that the light source part temperature (Tlsr) drops to the value Tl7 (Point F in FIG. 17).

(13) The processing device such as the microcomputer of the control part 21 uses the Formula (4) stored therein to obtain the optimal set temperature (Tppln_opt)Tp4 of the wavelength conversion element when (Tlsr, Pinput)=(Tl7, Pi2) is established (Point G in FIG. 17).

The above-mentioned operation is performed until the light source part temperature (Tlsr) no longer changes. Then, the optimal set temperature (Tppln_opt) becomes stable in a certain state.

In the above-described example(s) (embodiment(s)), the optimal set temperature is calculated on the real-time basis by using the Formula (4) together with the processing device such as the microcomputer. It should be noted, however, that the arithmetic processing may be carried out using the above-mentioned Formulas in advance, prior to starting the power supply to the semiconductor laser 2, for the sake of arithmetic processing speed of the processing device. Then, a table which is similar to the Table 1 may be prepared and stored in the storage unit. By referring to the prepared table, the optimal set temperature (Tppln_opt) of the wavelength conversion element 5 may be updated.

REFERENCE SIGNS LIST

1 Base plate
2 Semiconductor laser
3 Shielding container
4 Fundamental wave light reflecting element (VBG)
5 Wavelength conversion element (PPLN)
6 Heat transfer plate
7 Heating unit (heater)
8 Dichroic mirror
9 Reflection mirror
10 Dichroic output mirror
11 Beam dump
12 Light source part
20 Power supply circuit
21 Control part
21a Optimal temperature setting unit
21b Temperature controller
21c Optimal temperature sequentially setting unit
31 Set temperature updating unit
32 Optical power meter
34 Storage unit
35 Semiconductor laser cooling device
Th1 Element temperature detecting unit
Th2 Light source part temperature detecting unit
LH Laser light source unit
U1 Electric power feeding circuit
U2 Pulse circuit
U3 Drive circuit
F1 Control unit
M1 DC power source
Q1, Q2, Q3 Switching elements
L1 Choke coil
C1 Smoothing capacitor
C2 Capacitor group
D1 Flywheel diode
G1, G2, G3 Gate drive circuits
I1 Supplied electric power-based current detecting unit
V1 Supplied electric power-based voltage detecting unit

The invention claimed is:

1. A laser light source apparatus comprising:
a light source part having a semiconductor laser, a wavelength conversion element configured to convert a wavelength of a laser beam emitted from the semiconductor laser, and an external resonator configured to select that laser beam which has a prescribed wavelength from the laser beam released from the wavelength conversion element and reflect the selected laser beam toward the semiconductor laser;
a power supply circuit configured to feed electric power to the semiconductor laser;
an element temperature detecting unit configured to detect temperature of the wavelength conversion element;
a heating unit configured to heat the wavelength conversion element;
a control part configured to control the power supply circuit;
a light source part temperature detecting unit configured to detect temperature of the light source part, the temperature of the light source part not including the temperature of the wavelength conversion element;
an optimal temperature setting unit configured to, when the wavelength conversion element is irradiated with the laser beam, configured to measure a plurality of light source part temperatures with the light source part temperature detecting unit, configure to measure a plurality of wavelength conversion element temperature with the element temperature detecting unit in connection with said plurality of light source part temperature, configured to select lowest light source part temperature from said plurality of light source part temperatures, configured to find wavelength conversion element temperature corresponding to the lowest light source part temperature, and configured to take the wavelength conversion element temperature corresponding to the lowest light source part temperature as an optimal temperature of the wavelength conversion element; and
a temperature controller configured to control an amount of electric power to be supplied to the heating unit based on a difference between the temperature of the wavelength conversion element detected by the element temperature detecting unit and the optimal temperature such that the temperature of the wavelength conversion element becomes the optimal temperature.

2. The laser light source apparatus according to claim 1, further comprising:
an optimal temperature sequentially setting unit configured to calculate a correction value to the optimal temperature of the wavelength conversion element, with the light source part temperature and/or a condition of the electric power to be supplied to the laser being a parameter, and correct the optimal temperature with the correction value.

3. A method of controlling temperature of a wavelength conversion element of a laser light source apparatus,
the laser light source apparatus including:
a light source part having a semiconductor laser, the wavelength conversion element configured to convert a wavelength of a laser beam emitted from the semiconductor laser, and an external resonator configured to select that laser beam which has a prescribed wavelength from the laser beam released from the wavelength conversion element and reflect the selected laser beam toward the semiconductor laser;
a power supply circuit configured to feed electric power to the semiconductor laser;
an element temperature detecting unit configured to detect the temperature of the wavelength conversion element;
a light source part temperature detecting unit configured to detect light source part temperature, the light source part temperature not including the temperature of the wavelength conversion element; and
a heating unit configured to heat the wavelength conversion element, the laser light source apparatus being configured to control an amount of electric power to be supplied to the heating unit based on a difference between the temperature detected by the element temperature detecting unit and optimal temperature of the wavelength conversion element, and configured to perform control such that the temperature of the wavelength conversion element becomes the optimal temperature of the wavelength conversion element, the method comprising:
altering temperature of the wavelength conversion element and measuring the light source part temperature at the respective temperature of the wavelength conversion element when the wavelength conversion element is irradiated with the laser beam to prepare a plurality of light source part temperatures in connection with a plurality of wavelength conversion element temperatures;
selecting lowest light source part temperature from said plurality of light source part temperatures to find wavelength conversion element temperature corresponding to the lowest light source part temperature;
taking the wavelength conversion element temperature corresponding to the lowest light source part temperature as the optimal temperature of the wavelength conversion element; and
controlling the amount of electric power to be supplied to the heating unit such that the temperature of the wavelength conversion element becomes the optimal temperature of the wavelength conversion element.

4. The method according to claim 3, further comprising:
calculating a correction value to be applied to the optimal temperature of the wavelength conversion element, with the light source part temperature and/or a condition of electric power to be supplied to the laser being a parameter;
correcting the optimal temperature with the correction value; and
controlling the amount of electric power to be supplied to the heating unit such that the temperature of the wavelength conversion element becomes the corrected optimal temperature.

5. The laser light source apparatus according to claim 1, wherein the wavelength conversion element includes a periodically poled lithium niobate.

6. The laser light source apparatus according to claim 1, wherein the semiconductor laser emits infrared light, and the wavelength conversion element converts the infrared light to visible light.

7. The laser light source apparatus according to claim 1, wherein the light source temperature detecting unit includes a thermistor.

8. The laser light source apparatus according to claim 1, wherein the external resonator includes a volume Bragg grating.

9. The laser light source apparatus according to claim 2, wherein the wavelength conversion element includes a periodically poled lithium niobate.

10. The laser light source apparatus according to claim 2, wherein the semiconductor laser emits infrared light, and the wavelength conversion element converts the infrared light to visible light.

11. The laser light source apparatus according to claim 2, wherein the light source temperature detecting unit includes a thermistor.

12. The laser light source apparatus according to claim 2, wherein the external resonator includes a volume Bragg grating.

13. The laser light source apparatus according to claim 2, wherein the optimal temperature sequentially setting unit calculates the correction value at fixed intervals, and corrects the optimal temperature at the fixed intervals.

14. The method according to claim 4 further comprising periodically performing said calculating a correction value to be applied to the optimal temperature, said correcting the optimal temperature with the correction value, and said controlling the amount of electric power to be supplied to the heating unit.

* * * * *